(12) United States Patent
Chiba et al.

(10) Patent No.: US 6,774,340 B1
(45) Date of Patent: *Aug. 10, 2004

(54) SHAPE OF MICRODOT MARK FORMED BY LASER BEAM AND MICRODOT MARKING METHOD

(75) Inventors: Teiichirou Chiba, Hiratsuka (JP); Ryuusuke Komura, Hiratsuka (JP)

(73) Assignee: Komatsu Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/576,681

(22) Filed: May 23, 2000

Related U.S. Application Data

(63) Continuation-in-part of application No. 09/448,127, filed on Nov. 24, 1999, now abandoned.

(30) Foreign Application Priority Data

Nov. 25, 1998 (JP) .......................... 10-334009
Nov. 25, 1999 (JP) .......................... 11-333824

(51) Int. Cl.⁷ ................... B23K 26/18; B23K 26/00; B41J 2/00; G03C 5/00
(52) U.S. Cl. ................ 219/121.68; 219/121.69; 219/121.73; 219/121.85; 347/110; 347/224; 430/322
(58) Field of Search .......... 219/121.68, 121.69, 219/121.73, 121.85; 430/322; 347/110, 224

(56) References Cited

U.S. PATENT DOCUMENTS

| | | | | |
|---|---|---|---|---|
| 3,623,603 A | * | 11/1971 | Casner et al. ............. | 209/3.3 |
| 4,613,842 A | * | 9/1986 | Ichiyama et al. .......... | 148/111 |
| 4,734,558 A | * | 3/1988 | Nakano et al. ........ | 219/121 LP |
| 4,786,358 A | * | 11/1988 | Yamazaki et al. ......... | 156/643 |
| 4,818,852 A | * | 4/1989 | Haddock et al. ........ | 219/121.69 |
| 4,847,183 A | * | 7/1989 | Kruger ..................... | 430/322 |
| 4,861,620 A | * | 8/1989 | Azuma et al. ............ | 427/53.1 |
| 5,175,774 A | * | 12/1992 | Truax et al. ................ | 382/8 |
| 5,191,187 A | * | 3/1993 | Kajikawa ............... | 219/121.76 |
| 5,260,542 A | * | 11/1993 | Ishiguro et al. ........ | 219/121.68 |
| 5,463,200 A | * | 10/1995 | James et al. ........... | 219/121.68 |
| 5,477,309 A | * | 12/1995 | Ota et al. ................ | 355/53 |
| 5,632,916 A | * | 5/1997 | Lappalainen et al. ... | 219/121.85 |
| 5,676,866 A | * | 10/1997 | in den Baumen et al. ..................... | 219/121.77 |
| 5,708,252 A | * | 1/1998 | Shinohara et al. ...... | 219/121.73 |
| 5,821,497 A | * | 10/1998 | Yamazaki et al. ....... | 219/121.69 |

(List continued on next page.)

FOREIGN PATENT DOCUMENTS

| | | | | |
|---|---|---|---|---|
| DE | 19810545 A1 | * | 9/1998 | ............ 219/121.68 |
| JP | 6-7971 A | * | 1/1994 | |
| JP | 6-226472 A | * | 8/1994 | |
| JP | 10-4040 | | 1/1998 | |
| JP | 11-156563 A | * | 6/1999 | ............ 219/121.68 |

OTHER PUBLICATIONS

PGPN US 2001/0014543 A1, Chiba et al., Semiconductor Wafer Including a Dot Mark of a Peculiar Shape and Method of Forming the Mark, Aug. 2001.*

*Primary Examiner*—L. Edmondson
(74) *Attorney, Agent, or Firm*—Bell, Boyd & Lloyd LLC

(57) ABSTRACT

A dot mark forming method for obtaining a dot mark includes a liquid crystal mask in which the maximum length of each pixel is 50 to 2,000 μm and is irradiated with a homogenized laser beam. The energy density of a split laser beam passed through the liquid crystal mask is set to 1.0 to 15.0 J/cm² and is condensed after the mask by a lens unit so that the maximum length of each dot becomes 1 to 15 μm. A single dot mask is formed on each laser irradiated point. The dot mark has a protrusion in the center which protrudes upward from the surface of the article to be marked. The length along the surface of the article is 1 to 15 μm and the height of the protrusion is 0.01 to 5 μm.

10 Claims, 23 Drawing Sheets

U.S. PATENT DOCUMENTS

| | | | | |
|---|---|---|---|---|
| 5,866,806 A | * | 2/1999 | Samsavar et al. | 73/105 |
| 5,928,750 A | * | 7/1999 | Gao et al. | 204/192.1 |
| 5,981,903 A | * | 11/1999 | Baumgart et al. | 219/121.68 |
| 6,068,891 A | * | 5/2000 | O'Dell et al. | 360/135 |
| 6,110,652 A | * | 8/2000 | Stork et al. | 430/322 |
| 6,144,397 A | * | 11/2000 | Chiba et al. | 347/241 |
| 6,160,603 A | * | 12/2000 | Tanaka et al. | 345/103 |
| 6,162,651 A | * | 12/2000 | Khosropour | 438/15 |
| 6,205,002 B1 | * | 3/2001 | Baumgart et al. | 345/103 |
| 6,248,973 B1 | * | 6/2001 | Matsumura et al. | 219/121.69 |
| 6,265,119 B1 | * | 7/2001 | Magome | 430/30 |
| 6,267,005 B1 | * | 7/2001 | Samsavar et al. | 73/105 |
| 6,268,641 B1 | | 7/2001 | Yano et al. | |
| 6,429,889 B1 | * | 8/2002 | Murokh | 347/224 |
| 6,436,842 B2 | * | 8/2002 | Chiba et al. | 438/758 |
| 6,437,454 B1 | * | 8/2002 | Chiba et al. | 257/798 |
| 2001/0006399 A1 | * | 7/2001 | Chiba | 347/224 |
| 2003/0015806 A1 | * | 1/2003 | Chiba et al. | 430/30 |

\* cited by examiner 62.50 × 62.50 [μm]

10.00 × 10.00 [μm]

10.00×10.00 [μm]

8.79×8.79 [μm]

10.00 × 10.00 [μm]

11.72 × 11.72 [μm]

30.00 × 30.00 [μm]

30.00×30.00 [μm]

30.00 × 30.00 [μm]

30.00 × 30.00 [μm]

SHAPE OF MICRODOT MARK FORMED BY LASER BEAM AND MICRODOT MARKING METHOD

This is a continuation-in-part of application Ser. No. 09/448,127, filed Nov. 24, 1999 now abandoned, incorporated by reference.

BACKGROUND OF THE INVENTION

1. Field of the Invention

The present invention relates to the shape of a dot mark and a method of forming the dot mark which is formed for product management or security in a specified position on the surface and the like of an item to be marked such as a semiconductor wafer, in a minute area on a scribe line, a rear surface of a wafer, a peripheral surface of a wafer, or an inner surface of a V-notch, a glass substrate such as a liquid crystal substrate, an electrode (pad) such as a bare chip, the surface of an IC, the rear surface of an IC, various ceramic products, and a lead portion of an IC. More specifically, the present invention relates to the shape of a dot mark of a small size having particular shape which secures optical visibility, and a method of forming the dot mark.

2. Description of the Related Art

For example, in semiconductor manufacturing processes, it is necessary to set various and strict manufacturing parameters for each process. In order to control the parameters, a mark such as numeral, character, or bar code is displayed by dots on the surface of a part of a semiconductor wafer. The number of manufacturing processes of a semiconductor is 100 or more and, moreover, a number of device forming processes and planarization processes are performed in each process. The processes include, for example, resist application, projection of a pattern onto a resist in a reducing manner, resist development, and planarization of various films such as an insulating film and a metal film for filling a gap which occurs by copper wiring or the like.

On the other hand, the mark made by dots is generally formed by irradiating the surface of a part of a semiconductor wafer with a continuous pulse laser beam through an optical system. The marking is not limited to once. In order to show historical characteristics of manufacturing processes, minimum historical data required in the manufacturing processes is usually marked. Since the marking area on the semiconductor wafer is, however, limited to an extremely narrow region, the size of the dot and the number of dots to be marked are accordingly limited. The marking area, the size of a dot, and the number of dots are specified by the SEMI standard and the like.

As disclosed in, for example, Japanese Laid-Open Patent Publication No. 2-299216, information of a semiconductor wafer on which the dot marking is performed is read as a change in reflectance of an emitted laser beam of an He-Ne laser or a change in vibration of a heat wave of an ordinary laser beam. On the basis of the read information, various manufacturing parameters in subsequent manufacturing processes are set. When the information is not accurately read and is read erroneously, therefore, all of semiconductor wafers become defective except for a coincidence. Most of the causes of the defective reading relates to an unclear mark formed by the dot marking. One of factors of the unclearness is the shape of a dot as an element of the mark.

It is generally considered that the influence by the depth of a dot is large. As disclosed in, for example, Japanese Laid-Open Patent Publication No. 60-37716, a dot is usually formed by melting and removing a part of the semiconductor wafer in a spot state with irradiation of a laser beam of a large energy so as to obtain a required dot depth. In, this case, the melted and removed portion is piled around the dot or scattered and adhered to the peripheral portion of the dot, and it may prevent device formation and exerts a large influence on the quality. Further, in case of dot marking performed by a YAG laser, due to the particularity of the YAG laser or the Q switch operation, a fluctuation is apt to occur in a laser output and a variation occurs in the depth or the size of a dot.

In order to solve the problems, for example, as disclosed in Japanese Laid-Open Patent Publication No. 59-84515 and 2-205281, the same point is repeatedly irradiated with a pulse laser beam of a relatively small energy. In the former Publication, in order to form a dot mark, while sequentially reducing the dot diameter pulse by pulse in order, the same point is repeatedly irradiated with a laser beam, thereby forming a deep dot. In the latter Publication, the frequency of a laser pulse of the first time is set to 1 kHz or lower and the frequency of a laser pulse subsequently emitted is set to a high repetitive frequency of 2 to 5 kHz to thereby form a dot having a depth of 0.5 to 1.0 $\mu$m or 1.0 to 1.5 $\mu$m.

On the other hand, since generation of dusts can not be avoided by the marking method as described above, a laser marking method which provides excellent visibility and suppresses the generation of dusts has been proposed in, for example, Japanese Laid-Open Patent Publication No. 10-4040. The disclosure of the publication relates to a laser marking method of forming a dot mark by projecting a liquid crystal mask pattern onto the surface of a semiconductor material by emitting a pulse laser beam, in which the energy density is set to 18 to 40 J/cm$^2$, the pulse width is selected within a range from 0.05 to 0.40 ms, the surface of the semiconductor material is irradiated with a pulse laser beam, and a number of small protrusions are created in the laser irradiation region in a process of melting and recrystallizing the surface of the semiconductor material.

According to the marking method, by the irradiation of the laser beam which is emitted on a pixel unit basis, a number of small protrusions each having the height of about 1 $\mu$m or less and the diameter of 0.5 to 1.0 $\mu$m are formed on the surface of an article to be marked. The interval between neighboring protrusions is about 1.5 to 2.5 $\mu$m and the density of the protrusions is 1.6 to 4.5×10$^7$ pieces/cm$^2$. The aggregation of a number of small protrusions are handled as a single dot mark which is read by utilizing an irregular reflection of light, and in case of such small protrusions, the generation of dusts in the event of the formation can be suppressed.

It is certain that one of the causes of unclearness of the dot mark having a hole shape (hereinbelow, the clearness of the dot is called "visibility") relates to the depth of the dot. Even when the dot is formed deep enough, however, in the case where the diameter of the opening is large, for example, when a laser beam strong enough to obtain a required depth is emitted, the energy density has generally a Gaussian distribution. The dot has therefore a smooth curved surface which is a gentle slope as a whole, so that a case where the difference between the dot and the peripheral area is not easily discriminated by the reading means as described above occurs. In the above publication of Japanese Laid-Open Patent Publication No. 2-205281, although the dot depth is specifically described as 0.5 to 1.0 $\mu$m or 1.0 to 1.5 $\mu$m, the diameter of the dot is not described at all, and the shape of the dot is merely described as a Gaussian shape.

In the disclosure of Japanese Laid-Open Patent Publication No. 59-84515, since it is described that the diameter of the dot opening of the first time is 100 to 200 μm and the depth is 1 μm or less and, specifically, the laser beam is emitted four times, the depth of the dot in this case is at most 3 to 4 μm. In the drawings of the publication, the shape of the dot formed at a time is similar to the Gaussian shape.

It can be therefore considered that dots each having a required depth, whose sizes are uniform to a certain degree are formed by any of the marking methods disclosed in the above publications. The shape of the formed dot is, however, like a conventional shape and the diameter with respect to the depth is extremely large. Thus the visibility still lacks certainty. Since the reduction in size (diameter) of the dot to be formed is not disclosed, the disclosure does not intended to reduce the conventional dimension of 50 to 150 μm. The numerical values at the present time point which are specified by, for instance, the SEMI standard are simply used. A substantial large increase in the number of dots and the dot forming area cannot be therefore expected and, moreover, it is difficult to mark various information.

The visibility of the dot mark is high when there is a large difference with respect to the light reflecting direction and the reflection amount between the mark and the periphery. When the depth is relatively large with respect to the diameter of the opening, the visibility is therefore high in the following manner. Since the reflecting direction of reflection light in the hole, incident at a predetermined incident angle, is not regular but is irregular, the reflection light outgoing from the opening of the hole to the outside is reduced. Assuming that the peripheral area of the hole is a smooth surface, the reflection light in the peripheral area is reflected in the same direction, so that the lightness is high. The visibility is high when the difference between the lightness and darkness is large.

The small protrusions formed by the marking method disclosed in Japanese Laid-Open Patent Publication No. 10-4040 are too small to be observed individually. The difference between the irregular reflection light amount of the irregular reflection surface as a surface of collection of the protrusions and the reflection light amount of the smooth surface is small, so that it is difficult to distinguish the irregular reflection surface from the peripheral smooth surface. The visibility is inevitably not good. Further, according to this publication, when an irradiated energy density is less than 18 J/cm$^2$, the small protrusion is not formed because the surface is not molten, however, this is because the pulse width is quite large and no special arrangement is made in the marking apparatus used.

Since a single dot mark is composed of a collection of small protrusions and there is no description regarding the size of one dot mark, it is regarded that the size of the dot is the same as that of the conventional dot and the dot mark forming area is limited. Even if the size of the dot which is the aggregation of the small protrusions obtained is small, the shape and size of a plurality of extremely small protrusions which are dispersed in one dot can not be controlled to be uniform, which makes no difference in lightness from its periphery so that the visibility of each dot further deteriorates.

SUMMARY OF THE INVENTION

The invention has been achieved to solve the above-described problems. Specifically, a first object is to obtain a dot mark shape having small and uniform shape and size and excellent visibility can be realized even by a single dot mark and a second object is to provide a dot marking method for accurately forming such a microdot mark. The other objects will become clear from the following description.

The objects are effectively achieved by the present invention.

The inventors of the present invention newly, specifically examined and analyzed conventional dot marking apparatuses and methods of such kinds and the dot shapes formed and found that the main factor which makes a microdot certainly visible though it is small is the dot shape and the ideal shape cannot be obtained by the conventional marking apparatuses and methods.

To be specific, for example, as shown in FIG. 2 and disclosed in Japanese Laid-Open Patent Publication No. 2-205281, according to the conventional marking apparatus, first, a character to be printed on a semiconductor wafer and a marking mode is set by an input unit 21. A marker controller 22 controls an ultrasonic Q-switched element 23, an internal shutter 24, an external shutter 25, an attenuator (optical attenuator) 26, and a galvanometer mirror 27 in order to mark a dot having a predetermined depth onto a wafer W in accordance with the set marking mode and one dot is marked by one Q-switched pulse. In FIG. 2, reference numeral 11 denotes a total reflection mirror; 12 an internal aperture (mode selector); 13 a lamp house; 14 an output mirror; 15 an aperture: 16 a leveling mirror; 17 a Galilean expander: 18 an aperture; 19 an f-θ lens; and 20 a YAG laser.

According to such a general marking method, as described above, since the energy density distribution of the laser beam emitted to the surface of the semiconductor wafer has the Gaussian shape, the inner surface of the dot formed on the surface of the wafer is gently curved by the influence of the energy density distribution. The marking methods are based on the invention of U.S. Pat. No. 4,522,656. The invention of this U.S. Patent is characterized in that, by irradiating the surface of a wafer with a laser beam having the diameter which is 1.5 to 6.5 times as large as the diameter of a dot to be marked, thermal conduction to the peripheral area is prevented, the energy is effectively used, and the central portion of the irradiation point is melted to form a hole.

In other words, the method effectively uses the energy density distributed in the Gaussian shape of the laser beam. The energy in a part corresponding to the bottom of the energy density distribution, in which the laser intensity is low, is directed to the periphery of the hole opening portion to thereby warm the periphery, prevent loss of the thermal energy by the heat conduction from the central portion of the hole, and effectively realize the hole formation in the central portion. However, since a part of the laser energy is not directly used for the hole formation but is consumed, the efficiency is low. Moreover, the heat history remains in the hole peripheral portion by irradiating the periphery of the hole with a laser beam and an adverse influence may be exerted on the product. Further, the marking method can form only a shallow dot mark having a large dot diameter as described above and the peripheral portion of the hole is swollen. It further deteriorates the visibility.

The inventors further examined the shape of the dot mark having excellent visibility and, as a result, found that by setting each of the pulse width and the energy density of the laser beam within a predetermined range as will be described hereinlater and controlling the energy density distribution, a dot mark formed by each laser beam emitted to the surface of an article to be marked has a peculiar shape which is not conventionally known and, though it is a single microdot mark, it has visibility higher than that of a dot mark shape having a recess formed by the conventional laser marking.

That is, according to the first aspect of the invention, there is provided a dot mark formed on the surface of an article to be marked by using a laser beam as an energy source. Although it is a microdot mark having a length along the surface of the article to be marked of 1.0 to 15.0 μm, the dot mark has the shape which is very visible and is made of dots each formed by a laser radiation point. The central portion of each dot mark has a protrusion which protrudes upward from the surface of the article to be marked and the height of the protrusion is 0.01 to 5 μm. In view of visibility, it has been found that the dot mark of the invention has the protruding shape, the height in the above mentioned range is sufficient because the dispersing light rather than regular reflection light is detected.

In order to clarify the mechanism of forming such a dot mark shape, the inventors have carried out a number of experiments from various viewpoints and, as a result made the inference as described below. Needless to say, other various inferences can be drawn.

That is, when each of dot forming positions is irradiated with a laser beam, the surface of the irradiated portion of the article to be marked is melted and a pool of the melted material (hereinbelow, called a melted pool) is created. At this time, the temperature of the melted material becomes lower toward the bank of the melted pool and becomes higher toward the center. Due to the temperature gradient, a distribution occurs in the surface tension, and movement occurs in the melted material. Simultaneous with the stop of the pulse irradiation, cooling starts and the material is solidified. In a state where the material is melted, the central portion of the melted pool is a free interface and the bank of the melted pool corresponds to a fixed end, so that the state is similar to that of a film whose periphery is fixed. In such a state, the surface tension acts and a dynamic motion similar to a film vibration occurs in the central portion of the melted pool.

The length of an amplitude in the film vibrating mode is determined substantially by the viscosity peculiar to the material and the surface tension, Therefore, the larger the diameter of the melted pool becomes, the number of vibrations increases. For example, in case of silicon, since the length of an amplitude is about 3 to 5 μm, a microdot shape having an effective contrast can be obtained in a small area. It was also confirmed by the experiments that a dot mark can be formed in the small area with little influence of the gravity.

When the laser irradiation pattern is square, the melted pool is accordingly square. When it is circular, the melted pool is accordingly circular. Further, the vibration similar to that of a film also occurs in a mode corresponding to the square or circular shape. FIGS. 22 to 31 schematically show square and circular film vibration modes. As the vibration mode becomes higher, the number of vibration waves increases and the vibration mode is shifted between a recessed pattern and a protruded pattern. It can be understood also by experimental results which will be described hereinlater that the motion of the melted pool has a strong correlation with the film vibration.

FIG. 22 shows a circular film vibration mode in a state where the surface of an article to be marked is expanded as an upward curved surface. FIG. 23 shows a circular film vibration mode in a state where the surface of an article to be marked is contrarily recessed as a downward curved surface. FIG. 24 illustrates a circular film vibration mode in a state where a ring-shaped recess is formed and the surface protrudes upward in an almost conical shape in the center of the ring-shaped recess on the surface of an article to be Marked. FIG. 25 shows a circular film vibration mode having a ring-shaped expanded portion and recessed a downward curved surface in the center of the expanded portion. FIG. 26 shows a circular film vibration mode having a ring-shaped expanded portion and conically protruding upward in the center of the expanded portion. FIG. 27 shows a circular film vibration mode concentrically having a ring-shaped recessed portion as an outermost portion, an expanded portion, and a recessed portion on the surface of an article to be marked.

FIGS. 28 to 31 show square-shaped film vibration modes corresponding to FIGS. 22 to 25, respectively. FIG. 31 in this case is peculiar in that an expanded portion does not have a simple ring shape but a waved shape in which the corners of a square are largely expanded.

As a result of a number of experiments, it was found that the dot mark shape in any of the film vibration modes is incomparably smaller than the conventional one and can be obtained by setting the pulse width and the energy density of the laser beam as marking parameters within their predetermined ranges and controlling the energy density distribution.

The laser marking apparatus disclosed in Japanese Patent Application No. 9-323080 proposed before by the inventors is a preferred example of a laser marking apparatus used to form the dot mark shape according to the first aspect of the invention. Since the detailed construction is described in the specification of the application, a simple description will be given here.

Reference numeral 1 in FIG. 1 denotes a marking apparatus for marking characters, bar code, 2D code, or the like on the surface of an article to be marked by using a laser as a light source. The marking apparatus 1 comprises a laser 2, a beam homogenizer 3 for homogenizing the energy distribution of a laser beam emitted from the laser 2, a liquid crystal mask 4 which is arranged to transmit/absorb the laser beam in accordance with the display of a pattern, beam profile converting means 5 for converting the energy density distribution of the laser beam corresponding to each pixel in the liquid crystal mask 4 into a required distribution, and a lens unit 6 for condensing the beam passed through the liquid crystal mask 4 onto the surface of the semiconductor wafer on a dot unit basis. The maximum length of one dot in the liquid crystal mask 4 is 50 to 2,000 μm and the maximum length of one dot in the lens unit 6 is 1 to 15 μm.

In order to form a microdot having such a shape, it is necessary to very accurately control the quality and quantity of the laser beam irradiated on a dot unit basis. In order to obtain a laser beam having a very small diameter of the invention from a laser beam having a large beam diameter, a high-quality high-power laser beam is necessary. It is however difficult to condense the laser beam any more due to the diffracting phenomenon of the high-power laser. Even if the laser beam can be condensed more, the angle of outgoing radiation of the lens becomes large and the depth of focus becomes extremely short, so that it is difficult to consider that an actual process can be performed. Further, an ultraprecise lens system is also required from the view points of resolution and the like. In case of equipping such a lens system, the cost of the facilities increases more, so that the lens system cannot be applied from the economic point of view.

In order to realize a microdot mark with an ordinary lens system, the laser beam itself emitted from the laser 2 is split and converted into laser beams each of a smaller diameter having an energy necessary and sufficient to mark one dot, and the energy density distribution of the laser beam on the dot unit basis has to be converted into a profile suitable to form the dot shape. In order to form a suitable and balanced profile, it is necessary to homogenize the energy density distribution of the laser beam on the dot unit basis, which is not yet converted, prior to the forming.

In order to obtain the light source for the microdot mark, It is rational to use the liquid crystal mask 4 in which liquid crystals of the liquid crystal mask 4 each capable of arbitrarily transmitting/absorbing light in accordance with various data written in the central control unit are arranged in a matrix.

It is important to convert the laser beam emitted from the laser having the Gaussian energy density distribution firstly into that having a homogenized shape similar to, for example, a top-hat shape by using the beam homogenizer 3. The types of the beam homogenizer 3 are as follows; a type of irradiating the surface of the mask at once by using, for example, fly's eye lens, binary optics, or cylindrical lens, and a type of irradiating the surface of the mask with a beam by using an actuator such as a polygonal mirror or a mirror scanner.

When the laser beam whose energy density distribution has been homogenized by the beam homogenizer 3 has then to be converted again into a profile of an energy density distribution suitable to obtain the preferred dot shape, the beam profile converter 5 is further used. As the beam profile converter 5, for example, a diffraction optical element, a holographic optical element, an opening mask or a liquid crystal mask having absorption/transmission regions, a convex or concave microlens array, and the like can be used. The beam profile converting means is not always necessary to obtain the dot mark shape of the invention.

The article W to be marked as a processing target in the invention is a semiconductor wafer, a glass substrate such an a liquid crystal substrate, an electrode (pad) such as a bare chip, the surface of an IC, various ceramic products, a lead portion of an IC, or the like. The semiconductor wafer is represented by a silicon wafer itself. It also includes a wafer on which an oxide film ($SiO_2$) or a nitride film (SiN) is formed, an epitaxial wafer, and a wafer on which gallium arsenide or indium phosphorus compound is formed.

The second aspect of the invention provides a marking position particularly preferable for the dot mark having particular shape. Namely, the surface on the article to be marked by dot marking is specified to be a beveled portion on an outer periphery of the wafer. It has been proposed conventionally to provide marking on the outer periphery of the wafer, however, the mark is consisted of so-called bar code. And when a usual dot mark is required to be formed on said surface, it is difficult to be formed on a small area due to its large size. Even when it is small, optical reading of the regular reflection light has been difficult. However, the dot mark of the invention is small and has a particular shape, and thus it has been found that sufficient optical visibility can be secured by utilizing the dispersing light from the surface of the protrusion. Further, when the dot mark is formed on the beveled portion of the wafer as described above, the mark would be hardly lost due to various treatments in the process of finishing the wafer.

The third aspect of the invention provides a marking method suitable to form the microdot mark having a peculiar shape on the surface of an article W to be marked. Even when the marking apparatus 1 is used, as long as the marking parameters specified by the third aspect of the invention are not satisfied, the dot mark of the invention having the above-mentioned peculiar shape cannot be obtained.

Specifically, the method according to the third aspect of the invention comprises the steps of: homogenizing an energy distribution of the laser beam emitted from the laser 2 by the beam homogenizer 3 as described above; forming a desired pattern by controlling the liquid crystal mask 4 in which the maximum length of each pixel is 50 to 2,000 μm and irradiating the liquid crystal mask with the laser beam homogenized by the beam homogenizer 3; setting the energy density of the laser beam on the dot marking surface, which passed through the liquid crystal mask 4 to 1.0 to 15.0 $J/cm^2$; and condensing the laser beam for each dot by the lens unit 6, which passed through the liquid crystal mask, onto the surface of the article to be marked so that the maximum length of each dot is set to 1.0 to 15.0 μm.

In order to form the dot mark having the peculiar shape of the invention, the inventors of the present invention have carried out a number of experiments to know how the wavelength, the energy density, and the pulse width of a laser beam exert an influence. As a result, the wavelength makes only the absorption ratio of the semiconductor wafer different but does not change others. When silicon is used as a material of the semiconductor wafer as an example, in order to obtain the dot mark shape of the invention, It Is necessary to moderately reduce the penetration to silicon as the dot shape becomes smaller. Consequently, the most preferable result is obtained at about 532 nm. Though the wavelength cannot be unconditionally specified since it differs according to the material of the article to be marked, preferably it is within the visible range of 300 nm to 700 nm.

On the other hand, with respect to the pulse width, a range in which a permissible range of the energy density can be set properly wide and the output of the laser can be suppressed as much as possible was examined. As a result, the range of 10 to 500 ns was found to be effective to form the dot mark of the invention. More preferably, the range is 50 to 120 ns. In the case of 500 ns or larger, the energy density becomes too high, so that the desired dot mark shape is not easily obtained and the laser itself inevitably becomes large. It should be understood that these values are quite small comparing with the pulse width according to the marking method disclosed in the above mentioned Japanese Patent Publication No. 10-4040. In a process performed to a ps area with a laser, transpiration occurs considerably and the permissible energy density range is extremely narrow.

The energy density largely depends on the laser wavelength, pulse width, and the optical characteristics of a material to be processed. Consequently, it is preferable to determine the energy density in consideration of both of the laser wavelength and the pulse width. In case of previously specifying the values of the laser wavelength and the pulse width as described above, it is appropriate to set the energy density of the laser beam on the dot marking surface, which passed through the liquid crystal mask 4 and split, to 1.0 to 15.0 $J/cm^2$. Assuming that the wavelength is the same, within the above mentioned pulse width range, when the pulse width is the smaller one, it is preferable that the energy density is within the range of 1.0 to 3.7 $J/cm^2$, and when the pulse width is the larger one, it is preferable that the energy density is within the range of 3.7 to 11.0 $J/cm^2$.

Strictly saying, a very thin native oxide film is formed on the surface of a semiconductor wafer, especially, made of silicon. In the invention, the oxide film is simultaneously deformed. It is therefore necessary to take the following points into account in order to preferably deform the oxide film.

1) The melting point of the oxide film (SiO$_2$) is higher than that of a silicon wafer (Si).
2) The oxide film is amorphous and has no clear change point to a liquid phase. It is softened around the melting point of silicon.
3) The oxide film is transparent from a visible region to a near infrared region and absorbs silicon.

From the above points, at the event of pulse irradiation, the silicon wafer is directly heated and melted through the oxide film. The oxide film is softened by thermal conduction from silicon and is formed in dots in accordance with the surface shape of silicon by elastic deformation. When the oxide film becomes thicker, however, the temperature rise in the oxide film by the thermal conduction is not sufficient at the interface of the oxide film, which is in contact with the outside. As a result, the temperature rise cannot keep up with the pace of the deformation amount of silicon and plastic deformation (crack) occurs.

The thickness of the oxide film on the surface which is in the film vibration mode at the time of dot formation similar to that of a completely bare wafer was found to be 1,500 to 2,000 angstroms by experiments. When the oxide film on the surface has the thickness of about 1,500 angstroms or less, dots can be formed in the film vibration mode similar to that of a bare wafer.

Preferably, in addition to the marking parameters, a parameter of disposing the beam profile converting means 5 at either the front or post stage of the liquid crystal mask 4 is included. The beam profile converting means S takes the form of a dot matrix of the same size as that of the pixel matrix of the liquid crystal mask 4 and converts the energy density distribution of a laser beam into a required distribution. The beam profile converting means adjusts the thermal distribution in the irradiation pattern dots, thereby adjusting the height of the protrusion of the dot mark.

The maximum length of each of pixels in the liquid crystal mask 4 is specified to 50 to 2,000 μm due to the limit of the resolution of an existing lens system when a laser beam transmitted the liquid crystal mask 4 is condensed on the article to be marked so that the maximum length of one dot is set to 1.0 to 15.0 μm by a lens system. When the maximum length (diameter) of one dot is smaller than 1.0 μm, it is difficult to read each dot by an existing optical system sensor. When the maximum length exceeds 15.0 μm, not only a sufficient amount of information cannot be marked on a predetermined area but also the marking area is limited. Each of the values is 3/20 to 1/100 of 100 μm which is the maximum size of the dot mark permitted by the present SEMI standard. It can be understood how small the sizes are.

DETAILED DESCRIPTION OF THE PREFERRED EXAMPLES

Preferred Examples of the invention will be specifically described hereinbelow in conjunction with comparative shapes with reference to the accompanying drawings.

Figure 1:
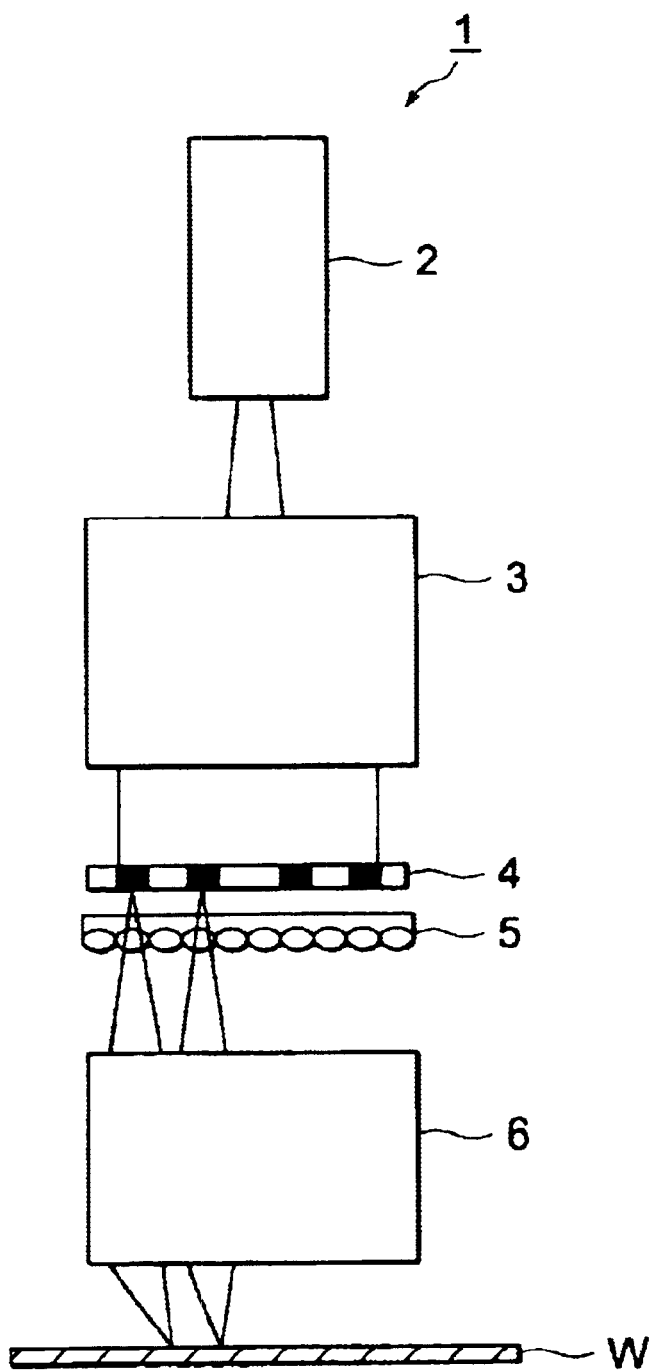
FIG. 1 is a diagram for schematically showing a microdot marking apparatus of the invention.
Figure 2:
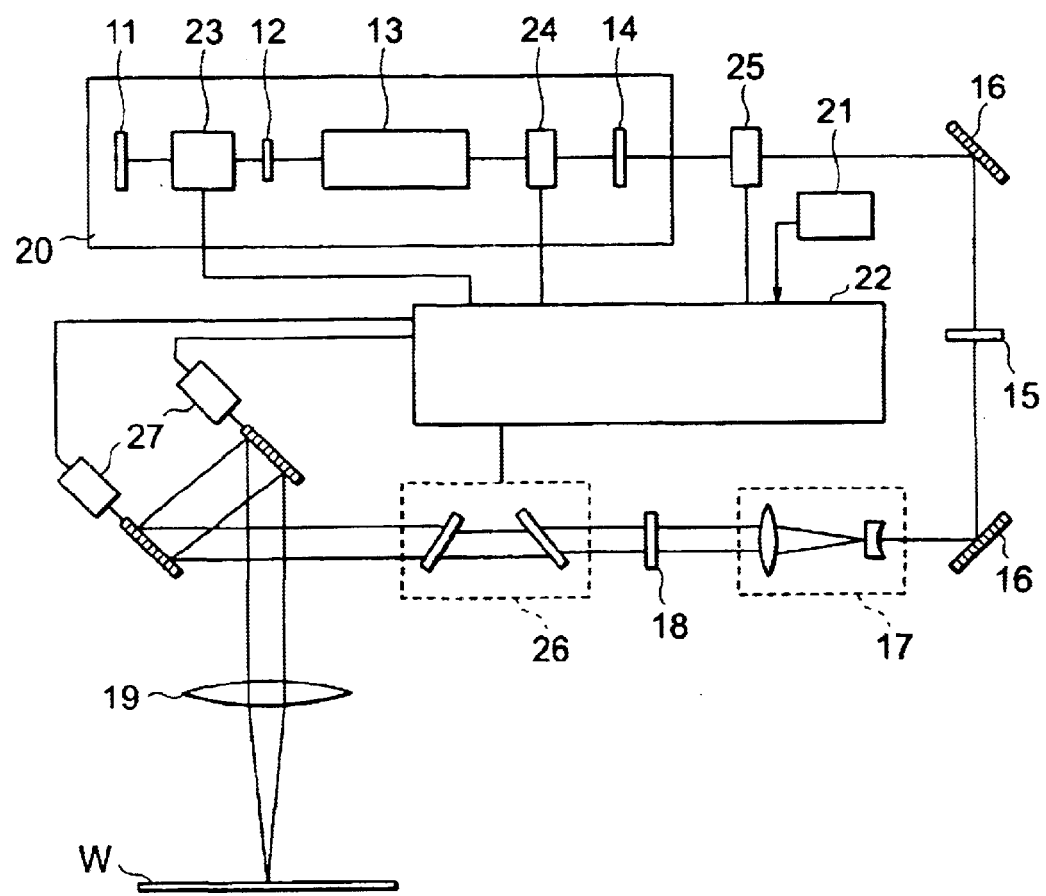
FIG. 2 is a diagram showing the whole construction of a general dot marking apparatus using a laser beam.

FIG. 1 is a diagram schematically showing an embodiment of a laser marking apparatus for forming a microdot mark of the invention.

In FIG. 1, reference numeral 2 denotes a laser oscillator; 3 a beam homogenizer; 4 a liquid crystal mask, 5 a bean profile converter; and 6 a condenser lens unit, and reference character W indicates an article to be marked. In the embodiment, as the article W to be marked, a semiconductor wafer is used as an example. The semiconductor wafer W in the embodiment includes not only a silicon wafer but also a general wafer such as a wafer on which an oxide film or a nitride film is formed, an epitaxial semiconductor wafer, and further a semiconductor wafer formed by using gallium arsenide or an indium phosphorus compound.

In the laser marking apparatus 1, a laser beam having a Gaussian energy density distribution emitted from the laser oscillator 2 is homogenized by the beam homogenizer 3 to that having a top-hat shaped energy density distribution whose peak values are almost the same. The surface of the liquid crystal mask 4 is irradiated with the laser beam having the energy density distribution homogenized as mentioned above. As widely known, a required marking pattern can be displayed on the liquid crystal mask 4. The laser beam passes through a pixel portion which is in a light transmittable state in a display region of the pattern. The energy density distribution of each transmitted light split on the pixel unit basis has the same shape as that homogenized by the beam homogenizer 3 and is uniform.

An optical component for allowing a laser beam having, for example, a Gaussian energy density distribution to have a shape of a homogenized energy density distribution is generically called the beam homogenizer 3. For example, there is an optical component of a system for irradiating the surface of an entire mask by using fly's eye lens, binary optics, or cylindrical lens or scanning the surface of a mask by performing a mirror operation by an actuator such as a polygon mirror or a mirror scanner.

In the invention, as described above, the pulse width of the laser beam is 10 to 500 ns and the energy density on the dot marking surface is controlled within the range from 1.0 to 15.0 J/cm$^2$, and preferably in the range from 1.5 to 11.0 J/Cm$^2$. When the laser beam is controlled within the range of such numerical values, the dot mark having a peculiar shape of the invention can be formed.

The area irradiated per time in the liquid crystal mask 4 is equal to the number of dots of 10×11. All of the dots are irradiated with a laser beam at a time. Since such number of dots is not often enough for necessary dots, the mark pattern may be divided into a plurality of sections and the liquid crystal mask is allowed to sequentially display the sections. By switching and combining the sections, the whole mark pattern may be formed on the wafer surface. In this case, in order to form an image on the surface of the wafer, it is naturally necessary to move the wafer or the irradiation position. As such a moving method, various methods which are conventionally known can be used.

In the embodiment, the beam profile converter 5 is irradiated with the laser beam on the dot unit basis, which has passed through the liquid crystal mask 4. In the beam profile converter 5, optical components are arranged similarly in a matrix in correspondence with the liquid crystals arranged in a matrix of the liquid crystal mask 4. Therefore, laser beam passed through the liquid crystal mask 4 goes through the beam profile converter 5 on the dot unit basis in a one-to-one corresponding manner, and the laser beam having the energy density distribution previously homogenized by the beam homogenizer 3 is converted into a laser beam having an energy density distribution necessary to form a microhole shape peculiar to the invention. Although the energy density distribution of the laser beam passed through the liquid crystal mask 4 is converted into the required energy density distribution by allowing the laser beam to further pass through the beam profile converter 5 in the embodiment, there is also a case where the laser beam is directly led to the lens unit 6 without converting the profile of the energy density distribution by the beam profile converter 5.

The laser beam passed through the beam profile converter 5 is condensed to a predetermined position on the surface of the semiconductor wafer W by the lens unit 6, thereby performing the necessary dot marking onto the surface. In the invention, the maximum length of each pixel in the liquid crystal which is 50 to 2,000 μm is reduced to 1 to 15 μm on the surface of the semiconductor wafer W by the lens unit 6. In case of uniformly forming a mark of a micron unit onto the surfaces of a plurality of wafers, it is necessary to adjust the distance between the marking surface and a condensing lens and the optical axis on the micron unit. According to the embodiment, the focal point is detected by measuring the height in accordance with a confocal method which is generally used in a laser microscope or the like, the obtained value is fed back to a fine positioning mechanism in the vertical direction of the lens, and the focal point is positioned automatically. A generally known method is adopted for the optical axis adjustment and the positioning and adjustment of optical components. For example, the adjustment is performed by a screw adjusting mechanism for matching an object to a preset reference spot by using guide light of an He-Ne laser or the like. It is sufficient to carry out the adjustment only once at the time of assembly.

The maximum length of the microdot mark on the marking surface according to the invention is therefore within the dimensional range from 1.0 to 15.0 μm. The protrusion/recess dimension is set to 0.01 to 5 μm in consideration of a case where the peripheral portion of the protrusion is slightly recessed. In order to form the dot mark having such a dimension, the length of one side of each dot in the liquid crystal mask 4 has to be 50 to 2,000 μm so as not to disturb a mark formation at the irradiation point on the surface of the semiconductor wafer W due to the limitation of the resolution of the condensing lens unit or the like. Further, when the interval between the beam profile converter 5 and the liquid crystal mask 4 is too large or too small, due to an influence of peripheral rays or an influence of instability of the optical axis, a mark formed on the surface of the semiconductor wafer tends to be disturbed. Therefore, in the embodiment, therefore, it is necessary to set the interval X between the beam profile converter 5 and the liquid crystal mask 4 to a value which is 0 to 10 times as long as the maximum length Y of each pixel in the liquid crystal mask 4. By setting the interval within such range, an image formed on the wafer surface becomes clear.

The beam profile converter 5 is an optical component for converting the energy density distribution homogenized by the beam homogenizer 3 into an optimum energy density distribution so as to obtain a dot shape peculiar to the invention. For example, by optionally varying a diffracting phenomenon, a refracting phenomenon, or a light transmittance at a laser irradiated point, the profile of the energy density distribution of an incident laser beam is converted into an arbitrary one. As the optical component, for instance, a diffraction optical element, a holographic optical element, a convex microlens array, or a liquid crystal itself can be used. Such elements or the like are arranged in a matrix and used as the beam profile converter 5.

Figure 3:
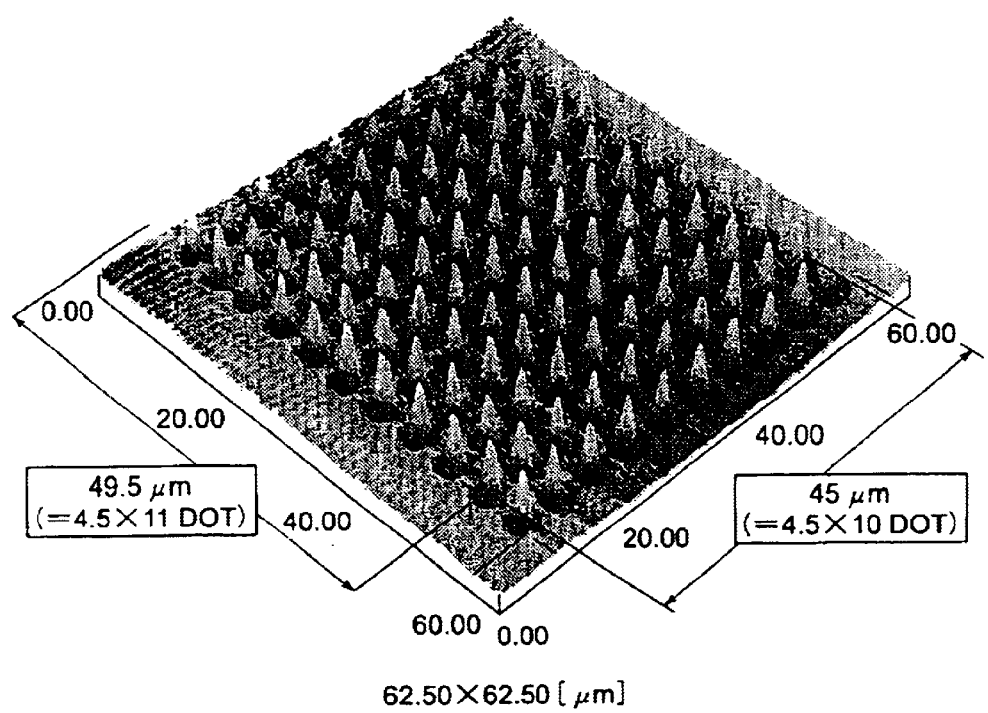
FIG. 3 is an AFM observed stereoscopic view of the shapes of dot marks formed by the method of the invention and their arrangement state.
Figure 4:
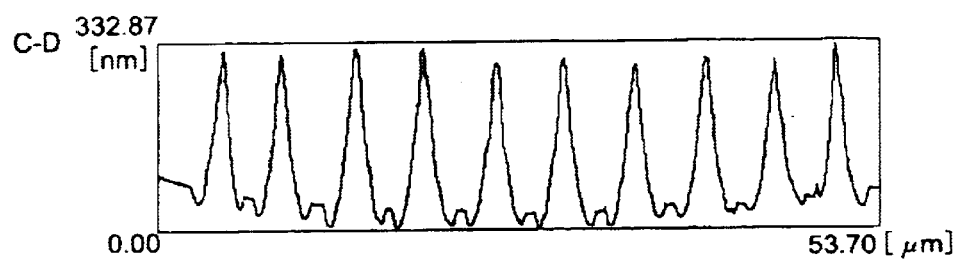
FIG. 4 is a cross section of the dot marks in FIG. 3.

FIGS. 3 and 4 illustrate a typical shape and arrangement of dot marks formed by the method of the invention. FIG. 3 is a stereoscopic view observed by an AFM and FIG. 4 is a cross section observed by the AFM. According to this embodiment, the shape of each dot mark formed on the surface of the semiconductor wafer W is a square of 3.6 μm and the interval between neighboring dots is 4.5 μm. As understood from the diagrams, almost conical-shaped dot marks each formed by a laser beam split in correspondence with each of pixels of the liquid crystal mask 4 are formed on the surface of the semiconductor wafer W. Moreover, the dot marks of 11×10 are arranged in order and their heights are almost the same. This is essentially different from the dot mark disclosed in the above mentioned Japanese Patent Publication No. 10-4040 in which an aggregation of a number of small protrusions which have various heights and are distributed randomly are handled as one dot. The above described dot marks having the same shape and arranged in rows can be formed since the energy distribution of the laser beam emitted to the liquid crystal mask 4 is homogenized by the beam homogenizer 3.

The dimension of the microdot mark according to the invention is as described above. That is, the maximum length along the surface of the article W to be marked is 1 to 15 μm and the height of the protrusion is 0.01 to 5 μm. The values are obtained by various experiments and are within the range from the minimum to the maximum necessary to assure the limit of the visibility of an existing optical sensor and the degree of freedom of the marking area.

FIGS. 5A, 5B to 16A, 16B illustrate the shapes of dot marks peculiar to the invention formed under the parameters of the method of the invention by the laser marking apparatus 1 adopted in the embodiment and the shapes of dot marks formed under the other parameters by the apparatus 1. The specification of the laser marking apparatus 1 is as follows.

| Laser medium: | Nd: YAG laser |
|---|---|
| Laser wavelength: | 532 nm |
| Mode: | TEM00 |
| Average output: | 4 W @ 1 kHz |
| Pulse width: | 100 ns @ 1 kHz |

A preliminary experiment as described below was conducted with respect to the wavelength of the laser beam to carry out the invention. Various preliminary experiments were carried out by setting the wavelength of a laser beam to three values of 355 nm, 532 nm, and 1064 nm, setting the energy density to 0.14 to 3.1 J/cm$^2$ as in the embodiments of the invention and comparative examples which will be described hereinlater, and setting the pulse width within the range of 10 to 700 ns. Although the absorption ratio of silicon differs between a case where the wavelength of the laser beam is 532 nm and a case where the wavelength is 1064 nm, a substantially same tendency was observed. The penetration to the silicon in the case of using the wavelength of 532 nm was, however, smaller. A better result was obtained as the dot becomes smaller. On the other hand, when the wavelength of the laser beam is set to 355 nm, the penetration to the silicon is too small and transpiration easily occurs on the surface of silicon. The wavelength of the laser beam is therefore set to 532 nm in the embodiment. The wavelength of the laser beam is not unconditionally specified in the invention.

As a laser beam used in the embodiment, a laser beam produced by a YAG laser oscillation apparatus, a second harmonic of a YV04 laser oscillation apparatus, a laser beam produced by a titanium sapphire laser oscillation apparatus, and the like can be mentioned.

FIGS. 5A, 5B to 17A, 17B show the shapes and dimensions of dots according to Embodiments 1 to 7 and Comparative examples 1 to 6 when the above marking parameters are used and, in addition, the diameter of a dot formed on the surface of the semiconductor wafer W, the energy density of the laser beam, and the pulse width of the laser beam are changed.

TABLE 1

| | Dot diameter (μm) | Energy density (J/cm$^2$) | Shape of dot mark |
|---|---|---|---|
| Embodiment 1 | 7.2 | 1.19 | Protrusion in the center |
| Embodiment 2 | 7.2 | 1.42 | Protrusion in the center |
| Embodiment 3 | 7.2 | 1.67 | Protrusion in the center |
| Comparative example 1 | 7.2 | 0.96 | Recess in the center |
| Embodiment 4 | 3.6 | 1.50 | Split protrusion |
| Embodiment 5 | 3.6 | 2.00 | Protrusion in the center |
| Embodiment 6 | 3.6 | 2.50 | Protrusion in the center |
| Embodiment 7 | 3.6 | 3.10 | Protrusion in the center |
| Comparative example 2 | 30 | 0.29 | Recess in the center |
| Comparative example 3 | 30 | 0.43 | Recess in the center |
| Comparative example 4 | 20 | 0.14 | Recess in the center |
| Comparative example 5 | 20 | 0.29 | Annular recess |
| Comparative example 6 | 20 | 0.43 | Volcano shape |

Figure 5A:
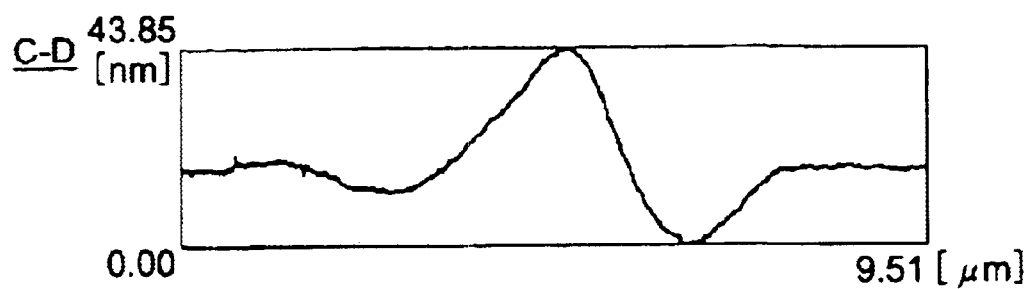
FIGS. 5A and 5B are AFM observed cross section and stereoscopic view of a dot mark shape according to a first embodiment.
Figure 5B:
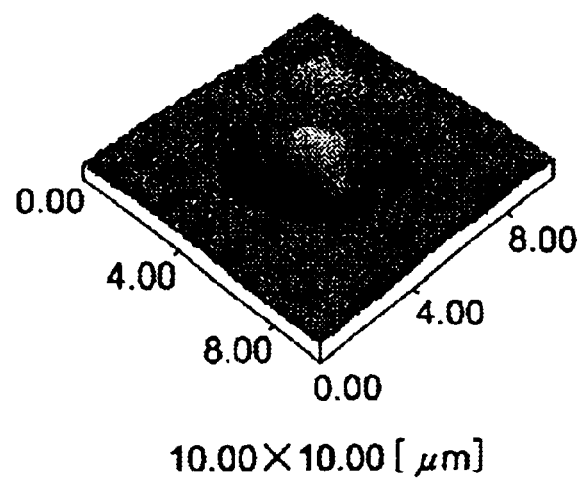
Figure 6A:
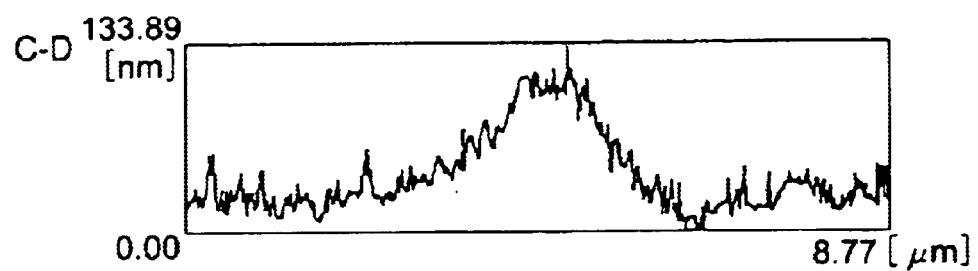
FIGS. 6A and 6B are AFM observed cross section and stereoscopic view of a dot mark shape according to a second embodiment.
Figure 6B:
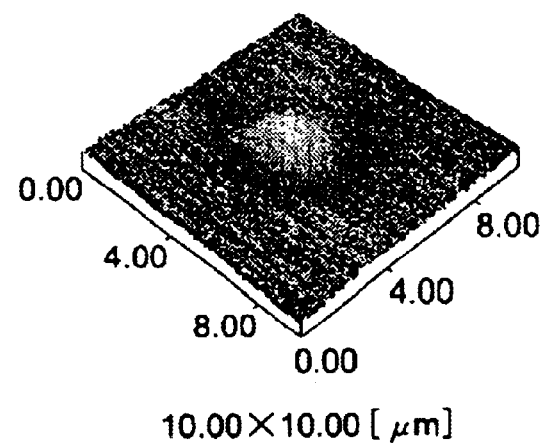
Figure 7A:
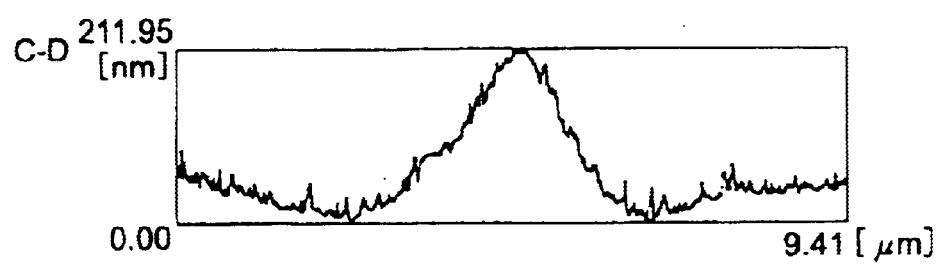
FIGS. 7A and 7B are AFM observed cross section and stereoscopic view of a dot mark shape according to a third embodiment.
Figure 7B:
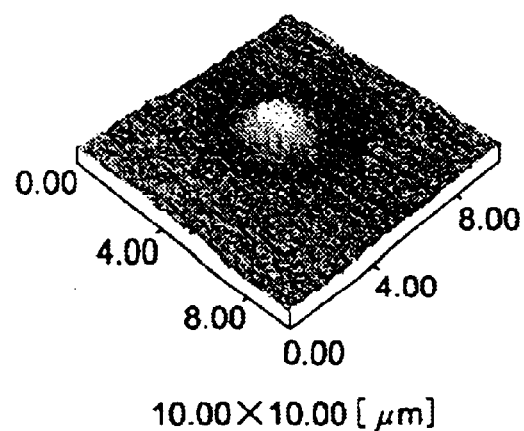

FIGS. 5A and 5B show the shape and dimension of a dot mark formed on the surface of the semiconductor wafer W under the marking parameter of Embodiment 1. In the diagrams, although there is an annular recess around the dot mark, the dot mark has an almost conical protrusion which upwardly protrudes high in the central portion. The contrast between the protrusion and the peripheral area is high and sufficient visibility is assured.

FIGS. 6A, 6B, 7A and 7B illustrate the shapes and dimensions of dot marks formed on the surface of the semiconductor wafer W under the marking parameters of Embodiments 2 and 3, respectively. In each of the diagrams, the peripheral area of the dot mark is almost flat and the dot mark has an almost conical protrusion which upwardly protrudes high. The contract between each of the dots and its peripheral area is high and sufficient visibility is assured.

Figure 8A:
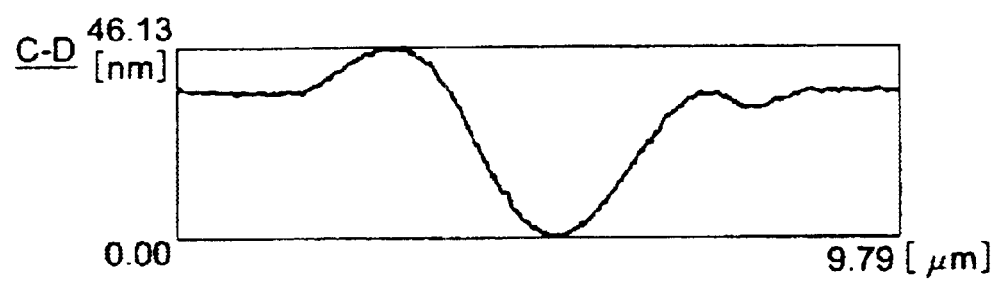
FIGS. 8A and 8B are AFM observed cross section and stereoscopic view of a dot mark shape according to a first comparative example.
Figure 8B:
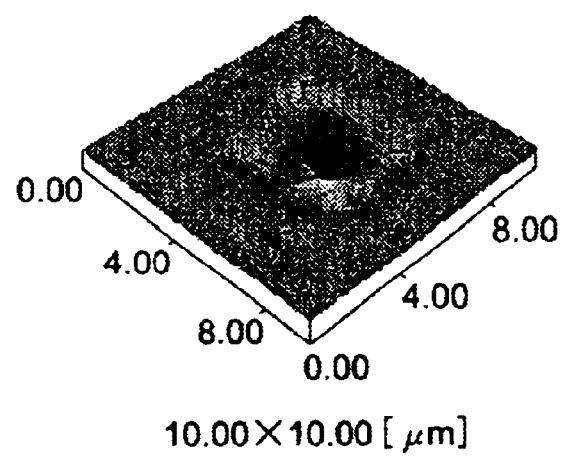

In Comparative example 1 shown in FIGS. 8A and 8B, although the length of the dot is the same as that of each of Embodiments 1 to 3 (the length of one side of the square is 7.2 μm), the energy density is 0.96 (<1.5) J/cm$^2$. Therefore, the dot has a large recess in the central portion, the contract is much lower as compared with the Embodiments, and the visibility is low.

Figure 9A:
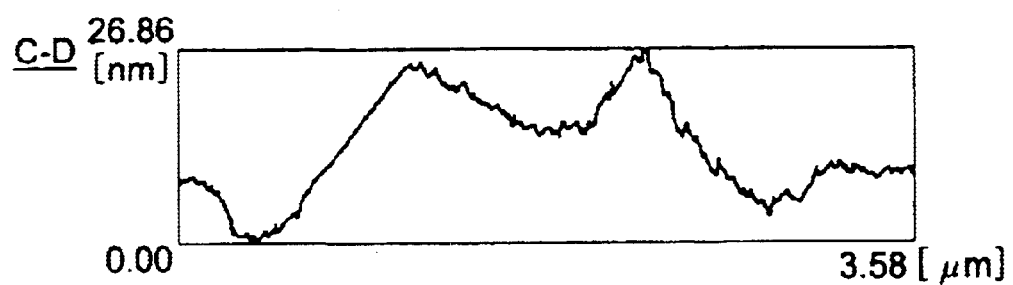
FIGS. 9A and 9B are AFM observed cross section and stereoscopic view of a dot mark shape according to a fourth embodiment.
Figure 9B:
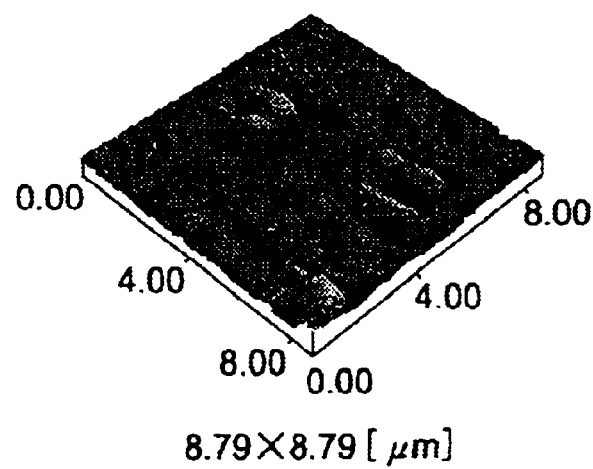
Figure 10A:
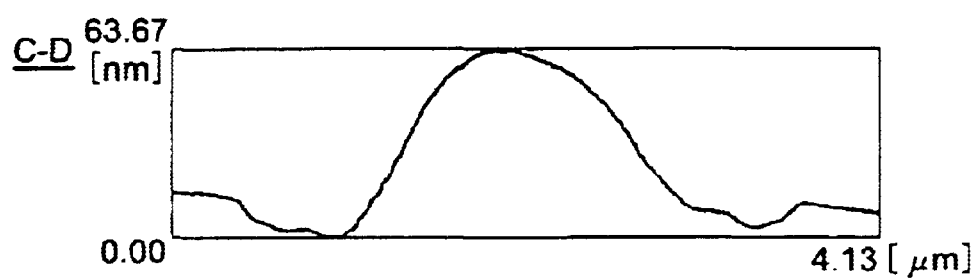
FIGS. 10A and 10B are AFM observed cross section and stereoscopic view of a dot mark shape according to a fifth embodiment.
Figure 10B:
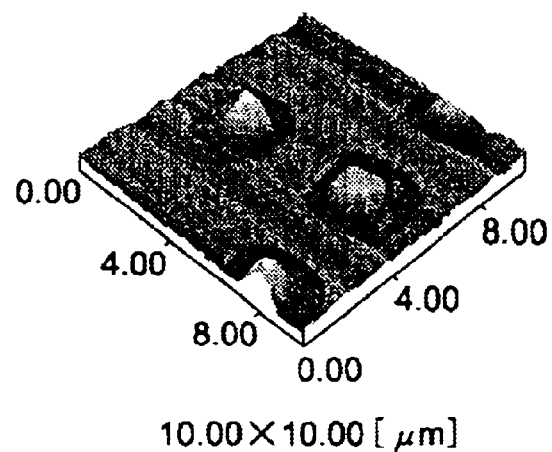
Figure 11A:
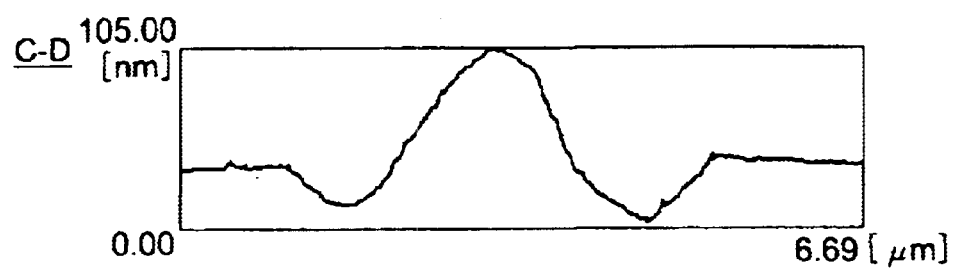
FIGS. 11A and 11B are AFM observed cross section and stereoscopic view of a dot mark shape according to a sixth embodiment.
Figure 11B:
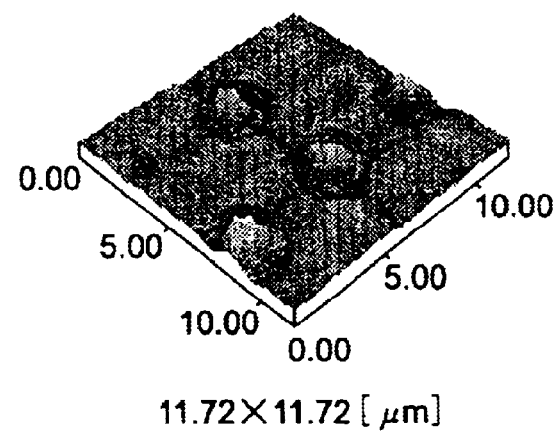

FIGS. 9A and 9B illustrate the shape and dimension of a dot mark formed on the surface of the semiconductor wafer W under the marking parameters of Embodiment 4. According to the Embodiment 4, although the length of the dot (length of one side of the square) is 3.6 μm which is the same as those of the Embodiments 5 to 7, the mountain-shaped protrusion is vertically split into two portions and a slight recess is formed in the peripheral area. Since the protrusion is large as a whole, however, the contrast between the dot and the peripheral area is high and the visibility is high.

FIGS. 10A and 10B and FIGS. 11A and 11B show the shapes and dimensions of dot marks formed on the surface of the semiconductor wafer W under the marking parameters of Embodiments 5 and 6, respectively. In the diagrams, although there is an annular recess in the peripheral area of the dot mark in a manner similar to Embodiment 1, the dot mark has an almost conical shaped protrusion which protrudes high in the center. The contrast between the dot mark and the peripheral area is high and sufficient visibility is assured.

Figure 12A:
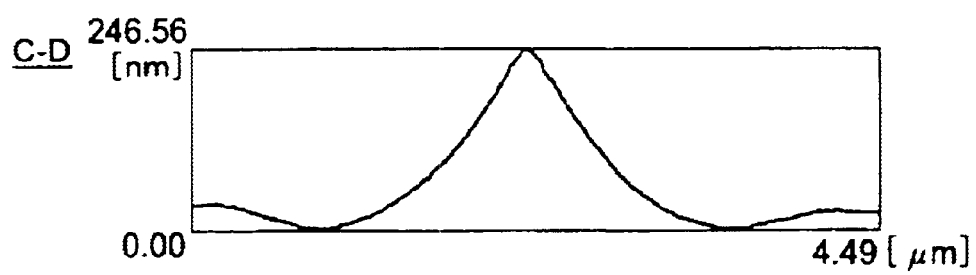
FIGS. 12A and 12B are AFM observed cross section and stereoscopic view of a dot mark shape according to a seventh embodiment.
Figure 12B:
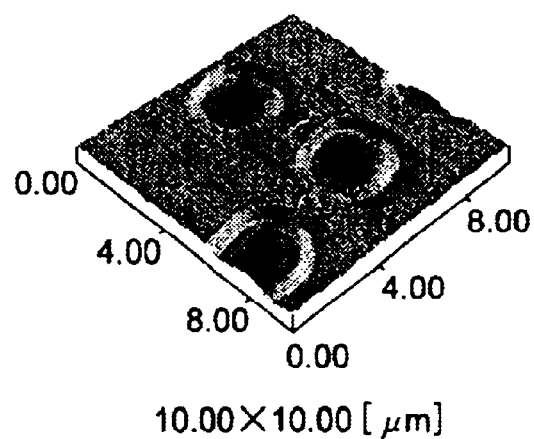
Figure 13A:
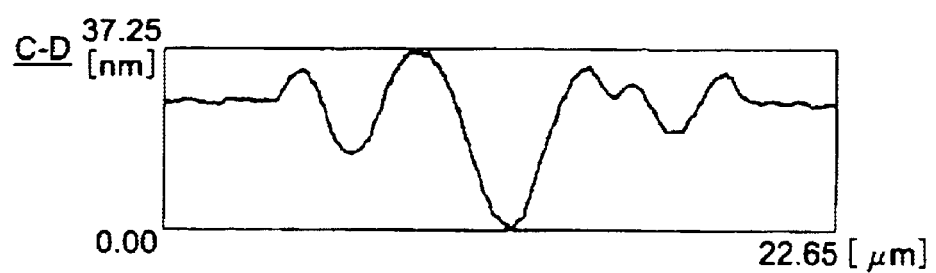
FIGS. 13A and 13B are AFM observed cross section and stereoscopic view of a dot mark shape according to a second comparative example.
Figure 13B:
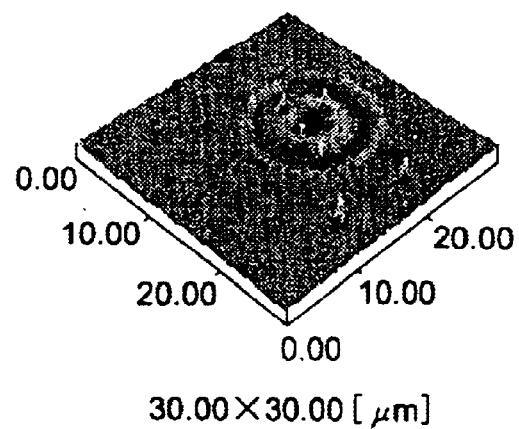
Figure 14A:
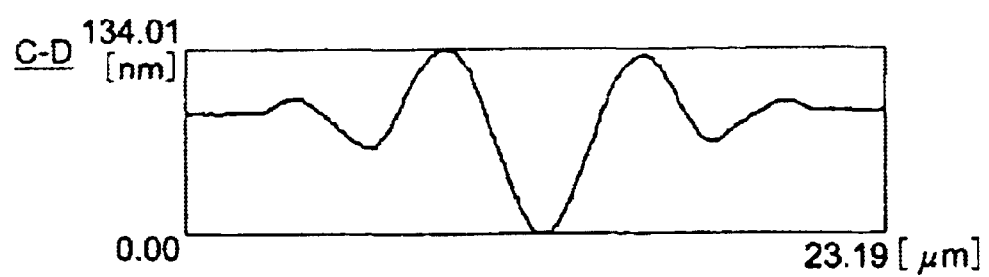
FIGS. 14A and 14B are AFM observed cross section and stereoscopic view of s dot mark shape according to a third comparative example.
Figure 14B:
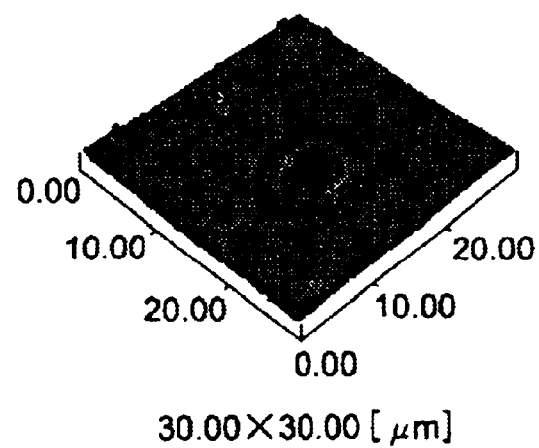
Figure 15A:
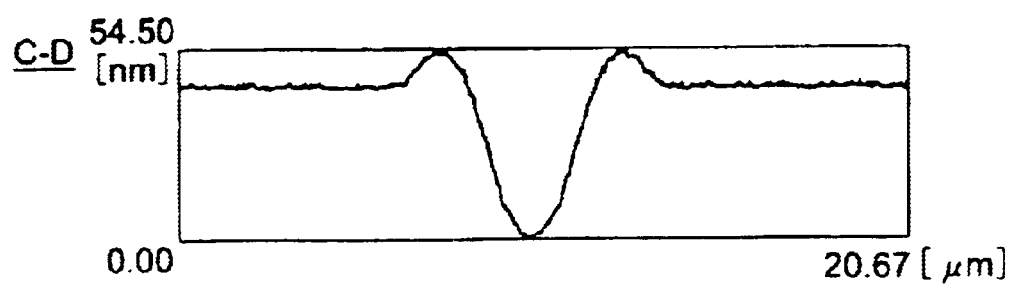
FIGS. 15A and 15B are AFM observed cross section and stereoscopic view of a dot mark shape according to a fourth comparative example.
Figure 15B:
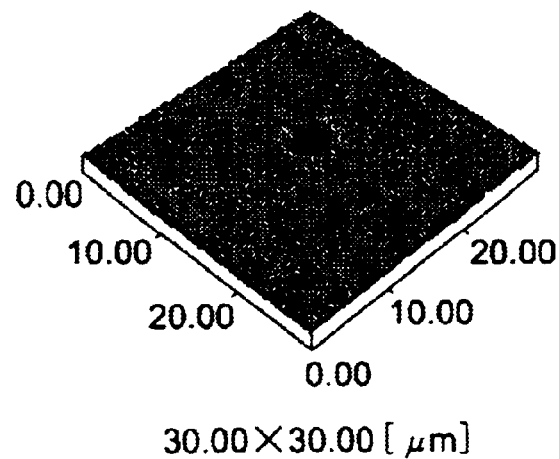
Figure 16A:
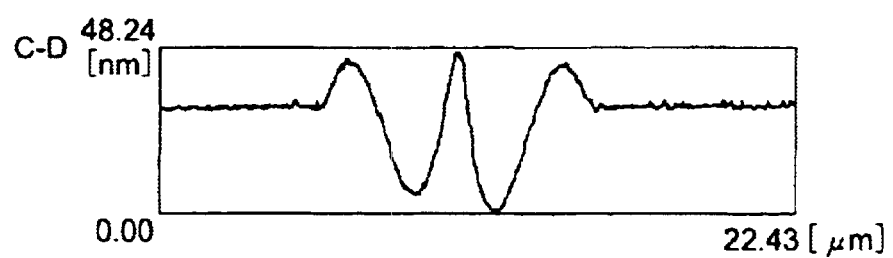
FIGS. 16A and 16B are AFM observed cross section and stereoscopic view of a dot mark shape according to a fifth comparative example.
Figure 16B:
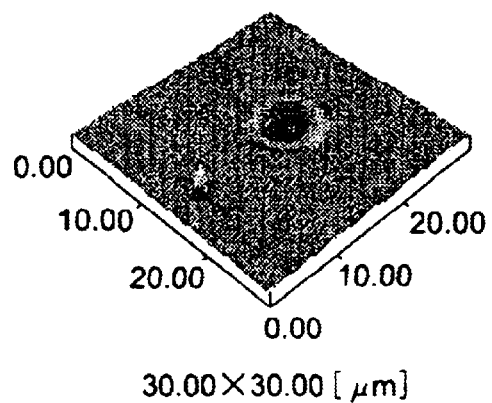

FIGS. 12A and 12B show the shape and dimension of the dot mark formed on the surface of the semiconductor wafer W under the marking parameters of Embodiment 7. In the diagram, the periphery of the dot mark is almost flat in a manner similar to Embodiment 3 and the dot mark has an almost conical shaped protrusion which upwardly protrudes high. Although the length of the dot is small, the dot mark is the most excellent with respect to the visibility. This shape of the dot is an ideal one of the invention.

Comparative examples 2 to 6 shown in FIGS. 13A, 13B to 17A. 17B cannot be regarded as embodiments of the invention irrespective of the shapes, as shown in Table 1 as well, since the length of the dot mark (the maximum length along the surface of the semiconductor wafer W) exceeds the range of 1 to 15 μm which is the object of the invention. Especially, each of Comparative examples 3 to 5 shown in FIGS. 13A, 13B to 16A, 16B has a large recess in the central portion. In each of Comparative examples 2 and 3 shown in FIGS. 13A, 13B and 14A. 14B, annular shallow recesses are formed around the central portion and the contrast between the dot mark and the peripheral flat portion is low. Unless the dot mark is large, the visibility is low.

Figure 17A:
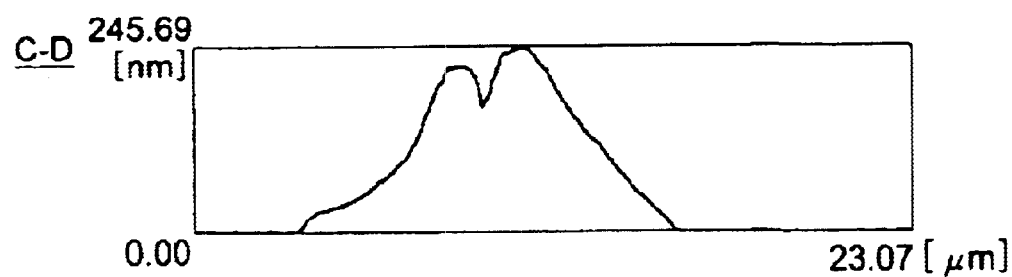
FIGS. 17A and 17B are AFM observed cross section and stereoscopic view of a dot mark shape according to a sixth comparative example.
Figure 17B:
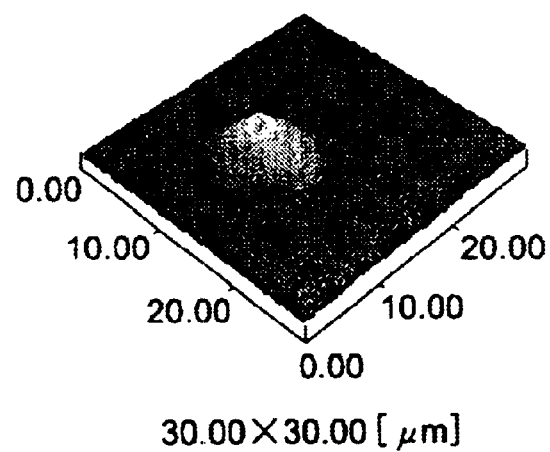

In Comparative example 6 shown in FIGS. 17A, 17B, the periphery is flat and the dot mark has a volcano-shaped protrusion having a recess in the center. Since the contrast is high, sufficient visibility is assured. The shape of Comparative example 6 is extremely effective as an ordinary dot mark.

Figure 18:
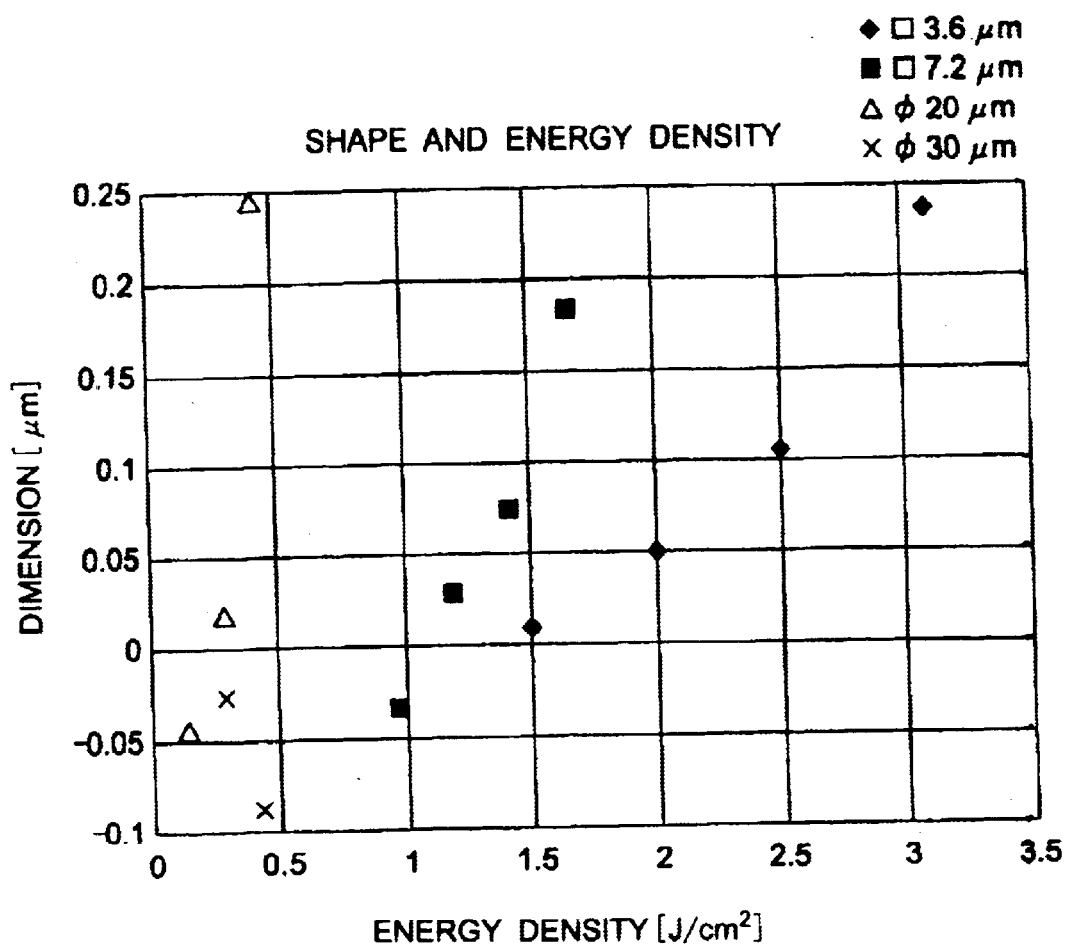
FIG. 18 is a graph showing the correlation between the energy density and the height of the protrusion in each of the dot marking of the first to seventh embodiments and the first to sixth comparative examples.

FIG. 18 is a graph obtained by plotting the energy density and the height of the protrusion of each of the dot marks of the embodiments and comparative examples. The dot mark in the shape peculiar to the invention has a protrusion. As can be understood from the graph, in each of the embodiments in which a microdot mark has the length (the length of one side of a square dot is 3.6 μm or 7.2 μm) less than the maximum length of the microdot mark as the object of the invention, the energy density has to be 1 J/cm² or higher.

The following can be understood from FIGS. 13A, 13B to 18, Embodiments 1 to 7, and Comparative examples 1 to 6.
1) The smaller the diameter (maximum length) of the dot mark is, the easier the protrusion is formed. The smaller the diameter of the dot mark is, the shorter the length of the free interface is. Since the viscosity of silicon solution is constant when the temperature is constant, it can be said that a lower vibration mode becomes dominant as a result.

2) In case of forming a protrusion having the same height, as the diameter of the dot mark becomes smaller, the higher energy density is required. Specifically, it corresponds to a case where the distance between fixed ends is shortened while maintaining a film vibration amplitude at the same value. The shorter the distance between the fixed ends is, the larger external force (temperature distribution of pulse irradiation=surface tension) is required.
3) A dot mark of a certain size is in a low order vibration mode which certainly has a protrusion. In the Table 1 above, when the diameter of the dot mark is 3.6 μm, all of the Embodiments have protrusions irrespective of their shapes.
4) A dot of a certain size or larger is always in the vibration mode of a recessed shape. That is, in these embodiments and examples, a point of inflection between the case where the protruded shape is dominant and the case where the recessed shape is dominant exists in the range of the diameters from 20 to 30 μm of the dot mark. The value is unconditionally determined from the viscosity of silicon solution, depth of the melted pool and size of the melted pool (diameter of the dot mark).

From the foregoing conclusion, by setting the various marking parameters specified in the invention, the small shape of the dot mark peculiar to the invention can be certainly and accurately formed.

Figure 19:
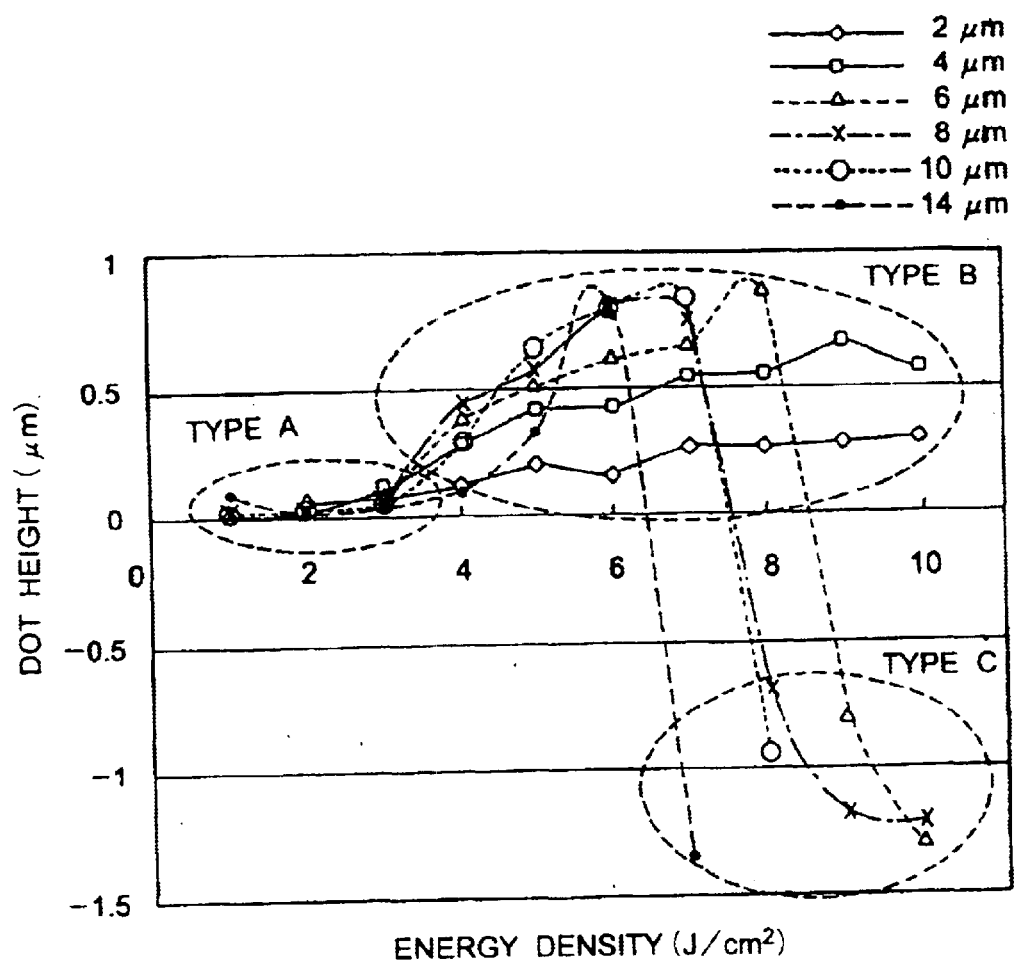
FIG. 19 is a graph showing correlation of the energy density and the height of the protrusion when the pulse width and marking width among the laser marking parameters in the first to seventh embodiments and first to sixth comparative examples are changed.

FIG. 19 is a graph which is drawn by plotting the energy density and the protrusion height of each of the dot marks formed when the pulse width is changed to 90 ns, without changing other specifications of the above described laser marking apparatus 1, and the energy density which is a marking parameter is varied.

The length of the dot mark along the marking surface is set to six types of 2 μm, 4 μm, 6 μm, 8 μm, 10 μm and 14 μm. The symbols in FIG. 19 means as follows: ◇ is for 2 μm, □ is for 4 μm, Δ is for 6 μm, X is for 8 μm, ○ is for 10 μm and ● is for 14 μm.

As is understood from FIG. 19, when the pulse width is changed from 50 ns to 90 ns, the heights of the small dot marks of 2 μm and 4 μm increase with respect to the energy density within the range of 3.5 to 11.0 J/cm². With respect to the dot marks of 6 to 14 μm, the heights of the protrusions gradually increase within the range of energy density of 6.0 to 8.0 J/cm², however, the protrusion height decreases sharply when the energy density exceeds a certain value, and the shape of the dot mark changes from protruding shape of type B to recess shape of type C.

It should be understood from FIGS. 18 and 19 that, in order to form dot marks having desired protrusion height of the invention, it is necessary to select the pulse width, energy density and the length along the marking surface appropriately, and as long as these values can be selected adequately, small and particularly shaped dot marks having predetermined width (length) and height (protrusion/recess), which characterizes the invention, can be formed.

Figure 20:
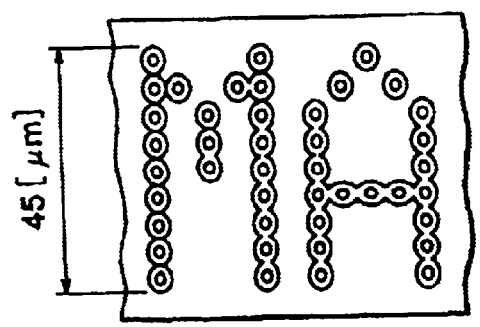
FIG. 20 is a plan view showing characters displayed by dot marks of the invention.
Figure 21:
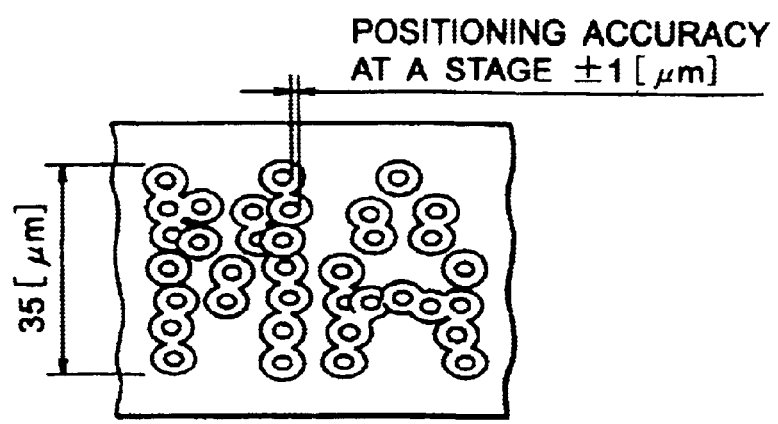
FIG. 21 is a plan view showing characters displayed by conventional dot marks.
Figure 22:
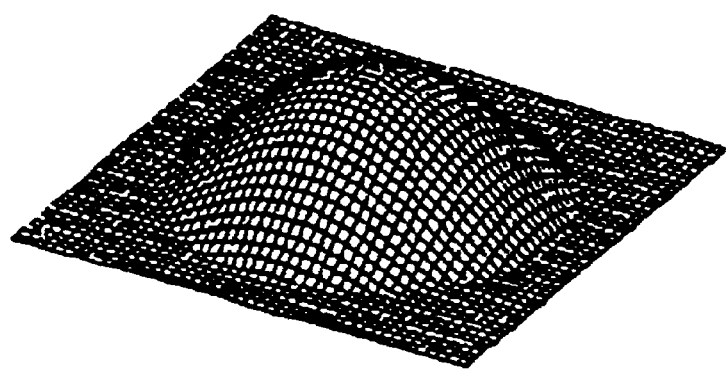
FIG. 22 is a stereoscopic view showing a first example of the dot mark shape based on a vibration mode of the surface of a melted pool in a dot mark forming process.
Figure 23:
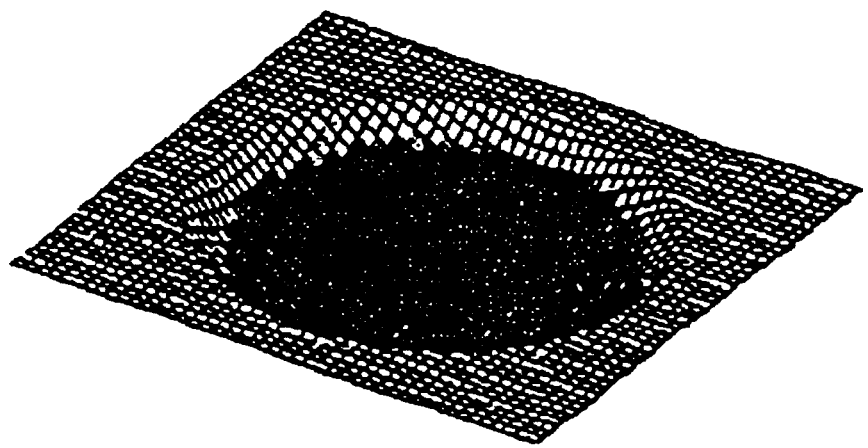
FIG. 23 is a stereoscopic view illustrating a second example of the dot mark shape.
Figure 24:
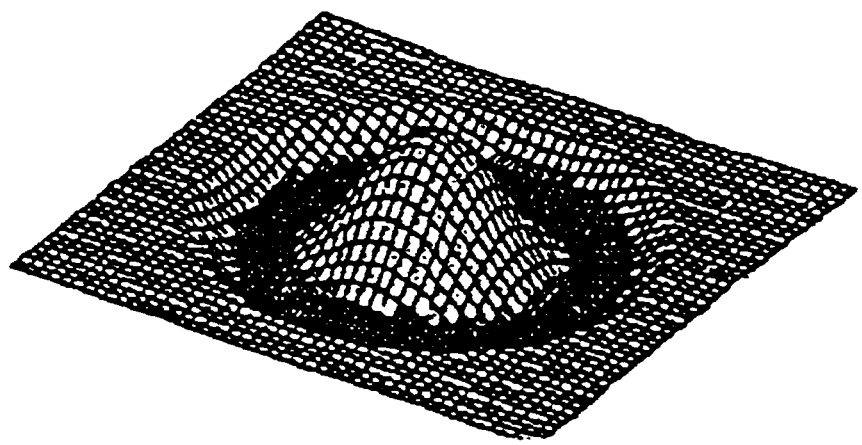
FIG. 24 is a stereoscopic view showing a third example of the dot mark shape.
Figure 25:
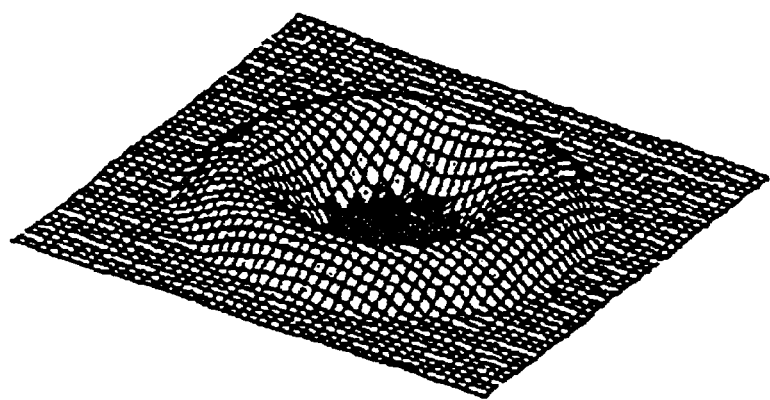
FIG. 25 is a stereoscopic view showing a fourth example of the dot mark shape.
Figure 26:
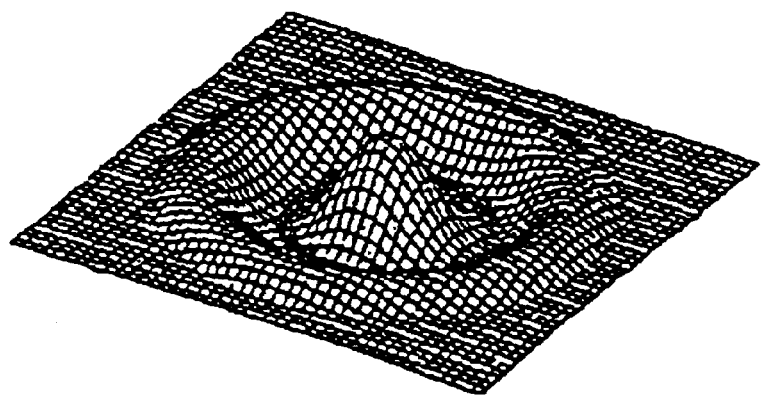
FIG. 26 is a stereoscopic view showing a fifth example of the dot mark shape.
Figure 27:
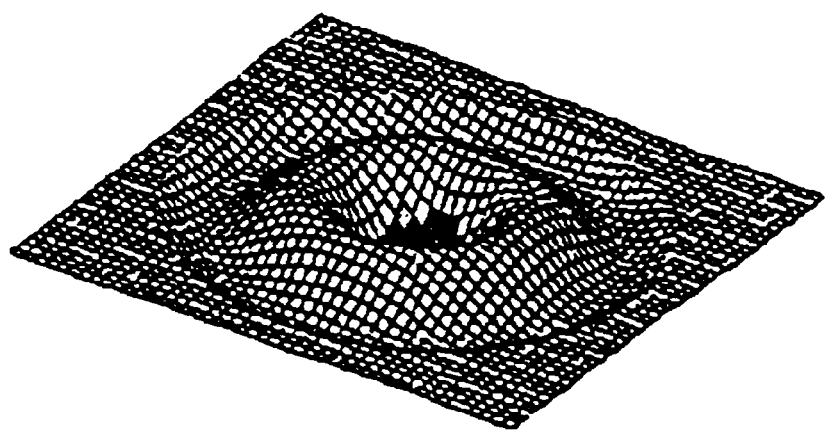
FIG. 27 is a stereoscopic view showing a sixth example of the dot mark shape.
Figure 28:
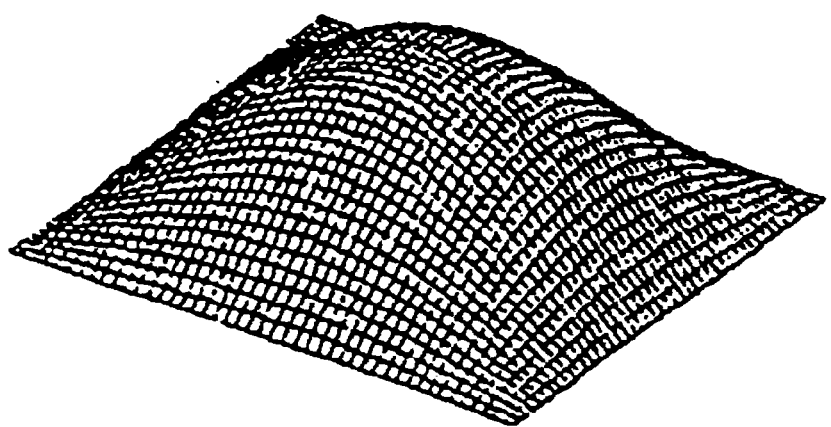
FIG. 28 is a stereoscopic view showing a seventh example of the dot mark shape.
Figure 29:
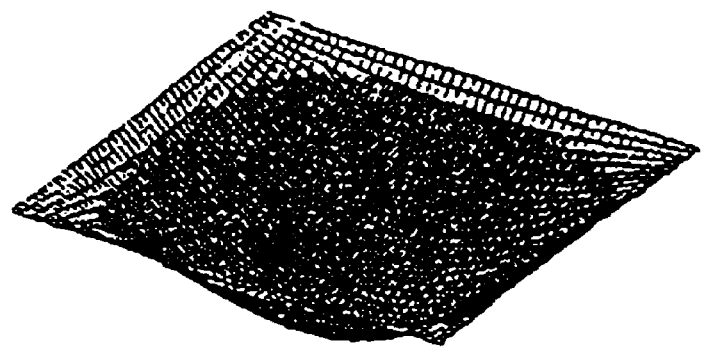
FIG. 29 is a stereoscopic view showing an eighth example of the dot mark shape.
Figure 30:
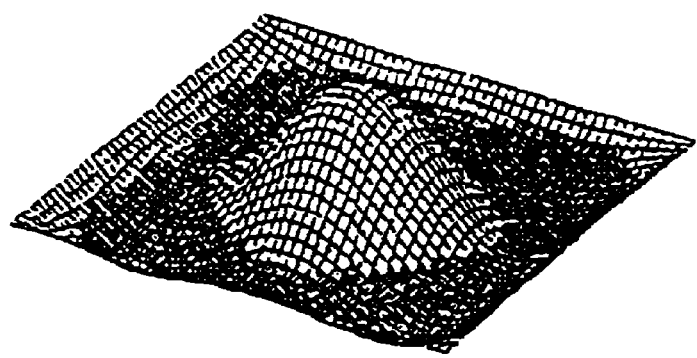
FIG. 30 is a stereoscopic view showing a ninth example of the dot mark shape.
Figure 31:
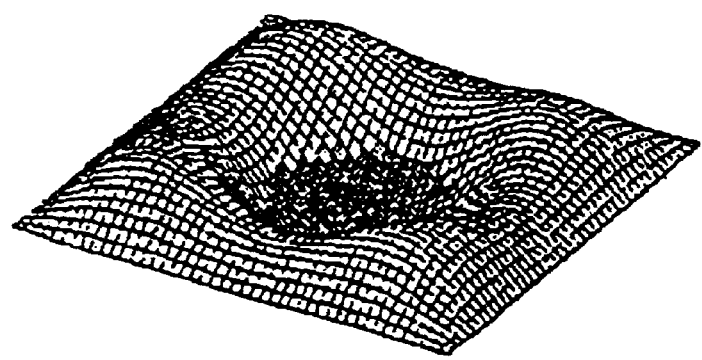
FIG. 31 is a stereoscopic view showing a tenth example of the dot mark shape.

FIG. 20 shows an arrangement of dot marks to display characters obtained by the dot marking according to the method of the invention. FIG. 21 shows an arrangement of dot marks to display characters obtained by conventional dot marking. In case of a 2D code, the relative position of dots is specified to 20% or less. For example, in case of a dot mark of ϕ5μm, when the positioning accuracy at a stage is ±1 μm, positional deviation of 20% occurs at random.

In case of adopting the conventional marking method, characters formed by dots are distorted as shown in FIG. 21 in relation to the positional accuracy of the dots. As a result, it cannot be read as a 2D code. On the other hand, as for the dot mark formed by the method of the invention shown in FIG. 20, the relative position of neighboring dots is zero in principle when the aberration of the lens is not taken into account. Generally, since the aberration of a lens increases in the outer peripheral area of the lens, when the central area (effective field of view) of the lens is used, it can be regarded as almost zero. Consequently, dots can be formed regularly and accurately as shown in FIG. 19.

As obviously understood from the above description, according to the dot mark shape and the dot marking method of the invention, microdot marks having uniform shapes each of which is 3/20 to 1/100 as compared with the conventional shape can be formed accurately in order in the areas on the dot unit basis on the surface of the semiconductor wafer. Moreover, since the dot mark has a peculiar shape whose central portion protrudes, which is not conventionally obtained, the visibility of the dot mark is excellent and the mark shape sufficiently functions as a 2D code as well.

Since the size of the dot mark of the invention is largely reduced as compared with the size of a conventional dot mark as described above and the boundary between the neighboring dot marks can be clearly seen, a number of dot marks can be formed in the same area. Not only the marking area is largely increased, but also the degree of freedom in selecting the marking area is also increased.

More specifically, the following effects are obtained.
1) A mark can be formed on the surface of a wafer at an arbitrary time.

For example, shipping test data of a wafer or the like can be marked at the time of shipping of the wafer from a silicon manufacturer without being influenced by the application of a device manufacturer to whom the wafer is delivered. Further, when shipping is performed on a wafer unit basis, test data of each chip, the wafer ID, and the chip ID can be marked in the area. Moreover, by forming a mark at a V-notch or a corner of an orientation flat portion, a fear such that the mark is too small to be found is eliminated.

Similarly, not only test data during an arbitrary process but also a wafer ID mark of the device manufacturer can be formed by the device manufacturer. Specifically, because the dot mark shape is particular and extremely small, it is possible to form various data of desired volume on the rear surface of each chip in the order of manufacturing steps before scribing at device makers, thereby history of each chip can be easily seized.
2) More chips can be obtained from a wafer.

According to the dot marking method of the invention, since the dot mark is extremely small, area dedicated for the marking can be omitted, the chip effective area such as not only the peripheral and rear surfaces of the wafer, but also the surface of the scribe line and the inner surface of the V-notch, as well as corners of the orientation flat portion, for example can be enlarged. Thus, the invention can contribute directly to improved yield of the wafer.
3) Burden on designing is lightened.

Since it is unnecessary to provide the marking area at the time of designing the chip, the designer can freely design a chip.

It is convenient for the invention that a general film formation is hardly performed to the wafer outermost area of 2 mm, especially, the outer side of 1 mm and the area is in an almost bare wafer state. Consequently, marking can be stably performed in this area.

What is claimed is:

1. A microdot mark shape which is formed on a surface of an article to be marked, wherein
the article to be marked is a semiconductor wafer,
a microdot mark is formed by laser irradiation and comprises a single dot mark on each laser irradiated point,
the mark has a single provision, which includes a concave portion provided around the protrusion and lower than a surface of the wafer and whose center portion protrudes upward marked so as to be higher than the surface of the wafer,
the length of each dot mark along the surface of the article to be marked is 1.0 to 15.0 $\mu$m.

2. A method of forming a mark made by dots on the surface of an article to be marked by laser beams emitted from a pulse laser oscillator, comprising the steps of:
homogenizing an energy distribution of the laser beam emitted from the laser oscillator by a beam homogenizer;
forming a desired pattern by driving and controlling a liquid crystal mask in which the maximum length of each pixel is 50 to 2,000 $\mu$m and irradiating the liquid crystal mask with the laser beam homogenized by the beam homogenizer;
setting the energy density on a surface to be marked, of a split laser beam which passed through the liquid crystal mask to 1.0 to 15.0 J/cm$^2$; and
condensing the laser beam for each dot by a lens unit, which passed through the liquid crystal mask, so that the maximum length of each dot is set to 1.0 to 15.0 $\mu$m and imaging each dot onto the surface of the article to be marked.

3. A microdot mark forming method according to claim 2, wherein said energy density of said split laser is set within a range of 1.5 to 3.7 J/cm$^2$.

4. A microdot mark forming method according to claim 2, wherein said energy density of said split laser is set within a range of 3.7 to 11.0 J/cm$^2$.

5. A microdot mark forming method according to claim 3, wherein beam profile converting means which takes the form of a dot matrix of the same size as that of a pixel matrix of the liquid crystal mask and converts an energy density distribution of the laser beam into a required distribution is provided at the front or post stage of the liquid crystal mask.

6. A microdot mark shape according to claim 1, wherein the height of the protrusion is 0.01 to 5.0 $\mu$m.

7. A microdot mark shape according to claim 1, wherein a periphery of the protrusion of said dot mark is recessed.

8. A microdot mark shape according to claim 1 wherein the surface of the article to be marked is a front or a rear surface of an integrated circuit.

9. A microdot mark shape according to claim 1, wherein said dot mark is so configured and arranged on the surface of the article to be marked for product management or various securities.

10. A microdot mark shape which is formed on a surface of an article to be marked, wherein
the article to be marked is a semiconductor wafer,
a microdot mark is formed by laser irradiation and comprises a single dot mark on each laser irradiated point,
the mark has a single protusion, which includes concave portion provided around the protrusion and lower than a surface of the wafer and whose center portion protrudes upward so as to be higher than the surface of the wafer,
the length of each dot mark along the surface of the article to be marked is 1.0 to 15.0 $\mu$m, and
the dot mark is formed for product management or various securities.

* * * * *